(12) United States Patent
Chung et al.

(10) Patent No.: US 11,227,917 B1
(45) Date of Patent: Jan. 18, 2022

(54) NANO-SHEET-BASED DEVICES WITH ASYMMETRIC SOURCE AND DRAIN CONFIGURATIONS

(71) Applicant: Taiwan Semiconductor Manufacturing Company, Ltd., Hsin-Chu (TW)

(72) Inventors: Cheng-Ting Chung, Hsinchu (TW); Yu-Xuan Huang, Hsinchu (TW); Yi-Bo Liao, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/082,954

(22) Filed: Oct. 28, 2020

(51) Int. Cl.
*H01L 29/66* (2006.01)
*H01L 29/417* (2006.01)
*H01L 29/78* (2006.01)
*H01L 29/08* (2006.01)
*H01L 21/8234* (2006.01)
*H01L 29/06* (2006.01)

(52) U.S. Cl.
CPC .. *H01L 29/0843* (2013.01); *H01L 21/823418* (2013.01); *H01L 21/823431* (2013.01); *H01L 29/0665* (2013.01); *H01L 29/6656* (2013.01); *H01L 29/6681* (2013.01)

(58) Field of Classification Search
CPC ......... H01L 21/02603; H01L 21/28141; H01L 21/823418; H01L 21/823431; H01L 21/823814; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/0843; H01L 29/41791; H01L 29/66439; H01L 29/6653; H01L 29/66553; H01L 29/6656; H01L 29/66795; H01L 29/6681; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2018/0006139 A1* | 1/2018 | Seo | H01L 29/66795 |
| 2019/0221483 A1* | 7/2019 | Mulfinger | H01L 21/28088 |
| 2019/0326288 A1* | 10/2019 | Hashemi | B82Y 10/00 |
| 2020/0044046 A1* | 2/2020 | Zhou | H01L 29/66545 |

* cited by examiner

*Primary Examiner* — David C Spalla
(74) *Attorney, Agent, or Firm* — Haynes and Boone, LLP

(57) ABSTRACT

A device includes a semiconductor substrate, a source feature and a drain feature over the semiconductor substrate, a stack of semiconductor layers interposed between the source feature and the drain feature, a gate portion, and an inner spacer of a dielectric material. The gate portion is between two vertically adjacent layers of the stack of semiconductor layers and between the source feature and the drain feature. Moreover, the gate portion has a first sidewall surface and a second sidewall surface opposing the first sidewall surface. The inner spacer is on the first sidewall surface and between the gate portion and the drain feature. The second sidewall surface is in direct contact with the source feature.

20 Claims, 19 Drawing Sheets

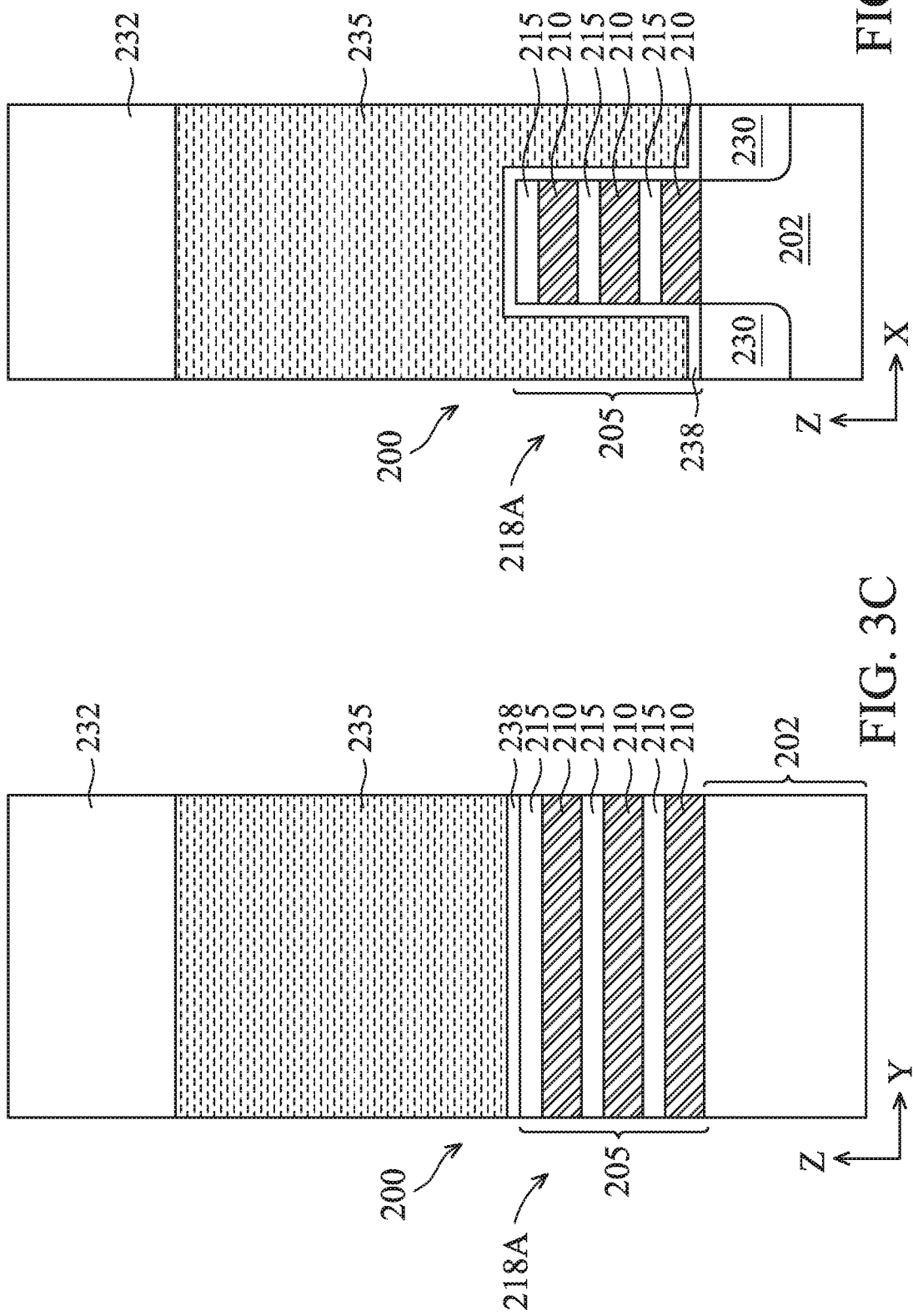

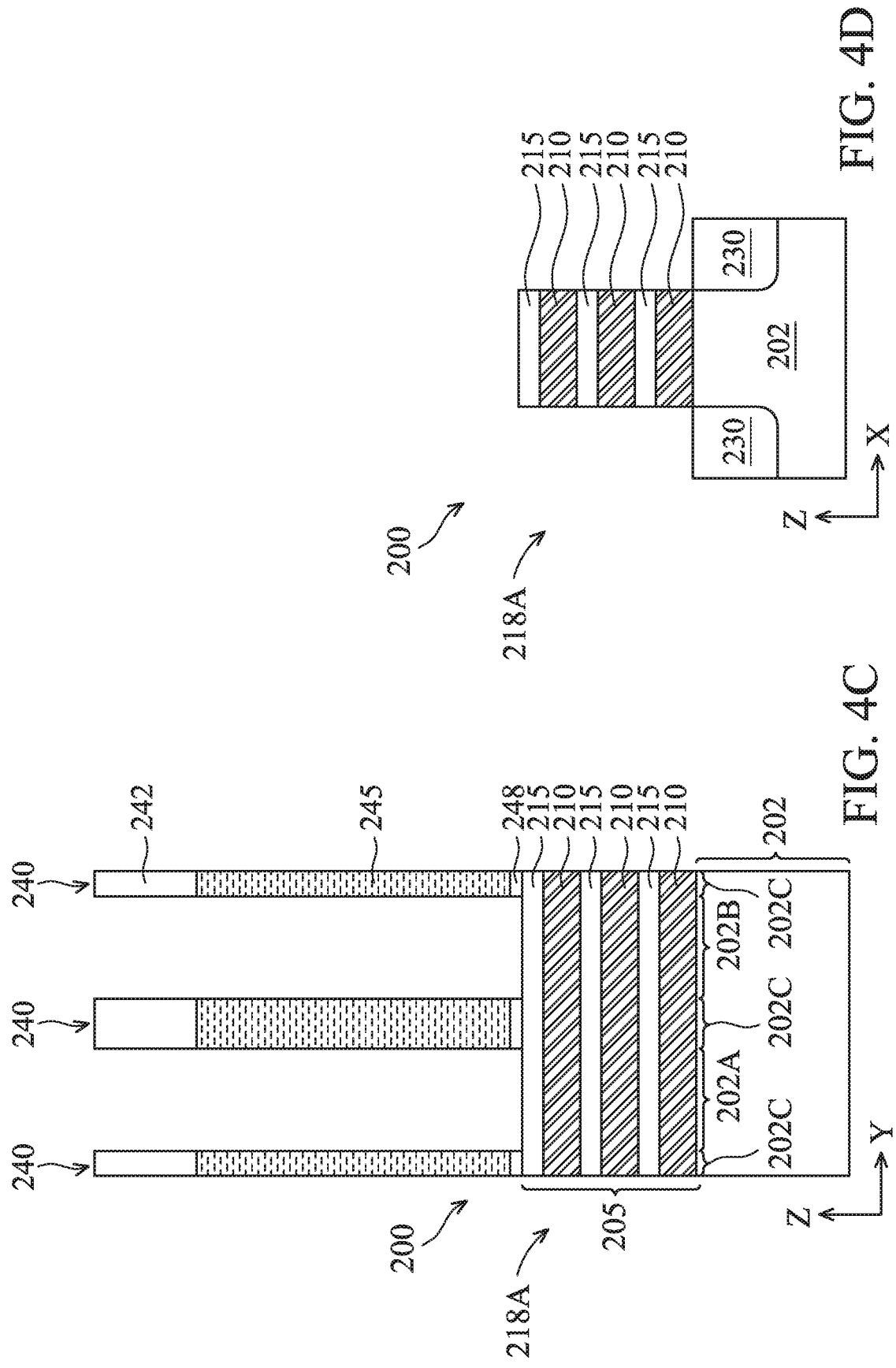

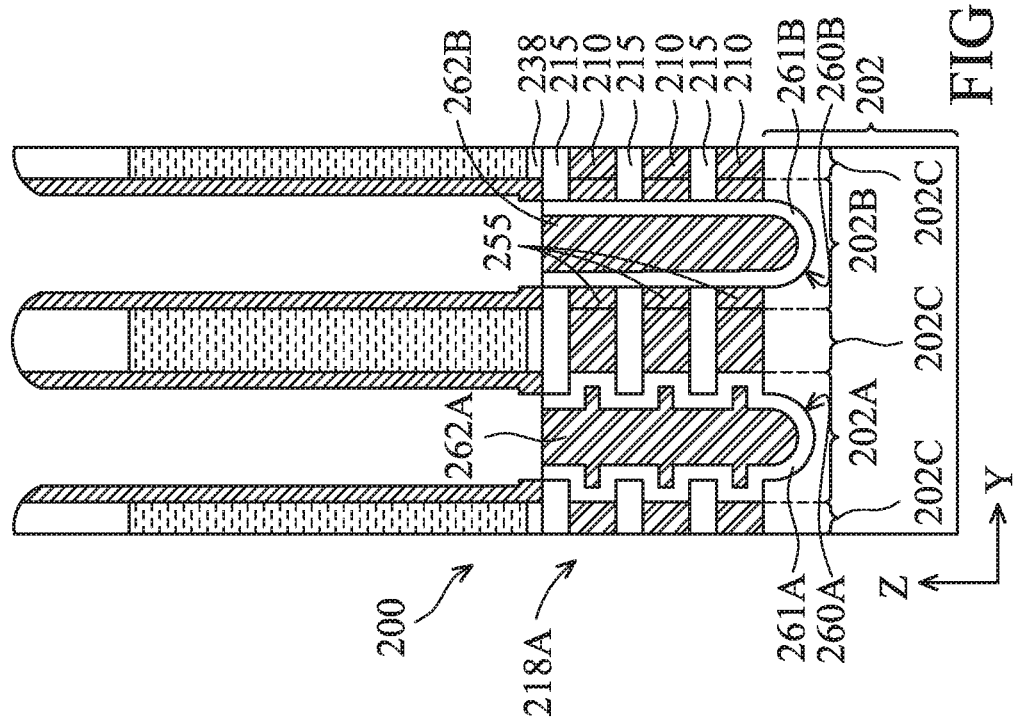
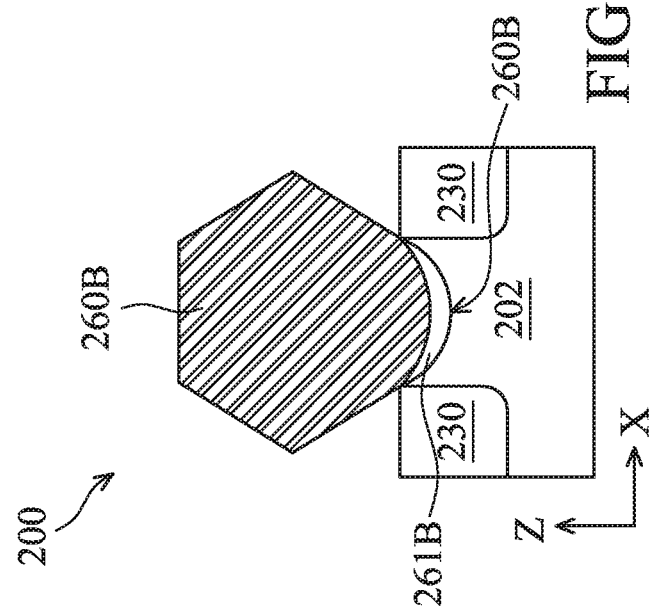
FIG. 13C
FIG. 13D

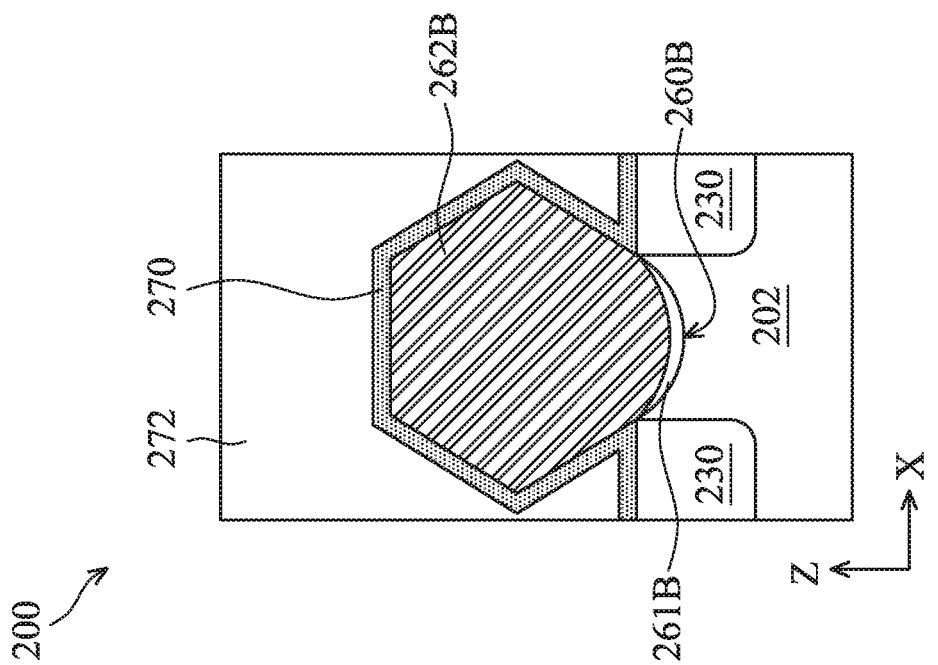
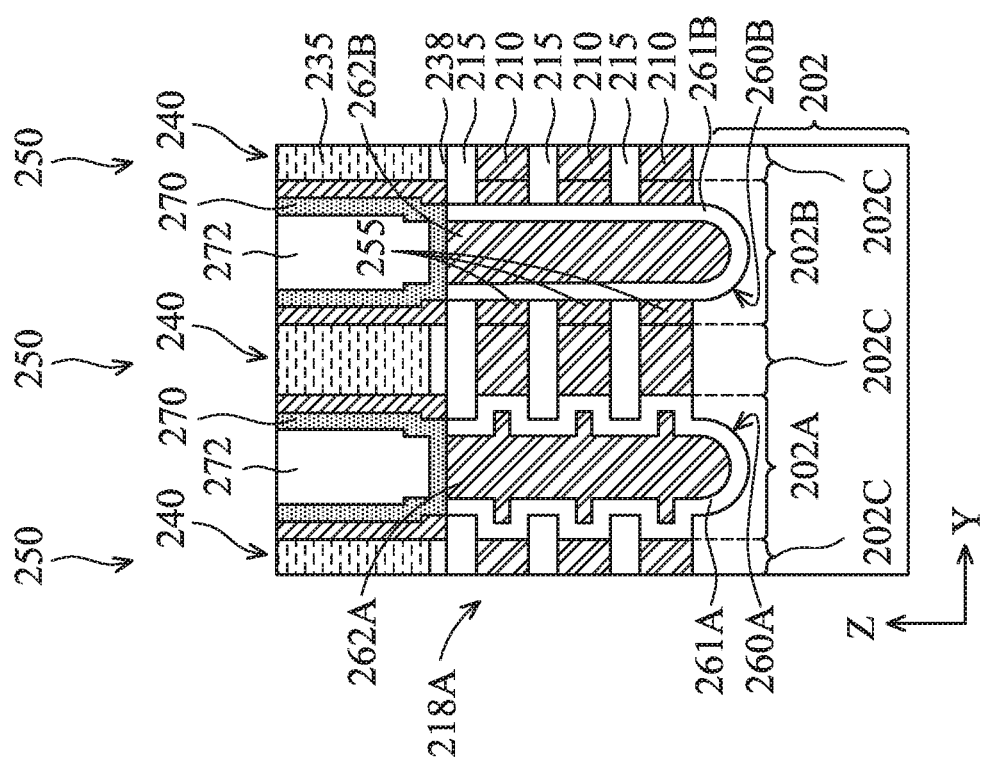
FIG. 14D
FIG. 14C

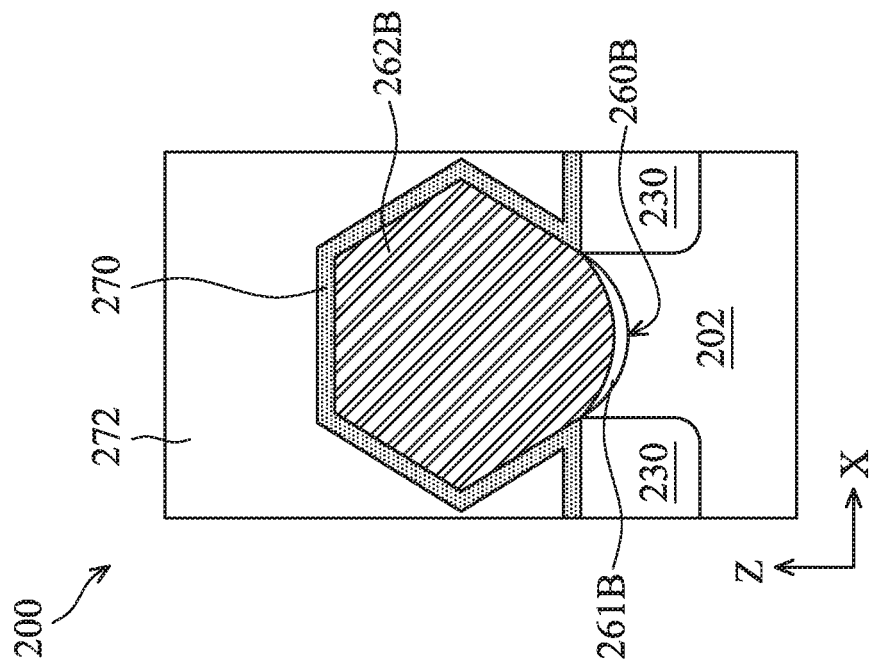
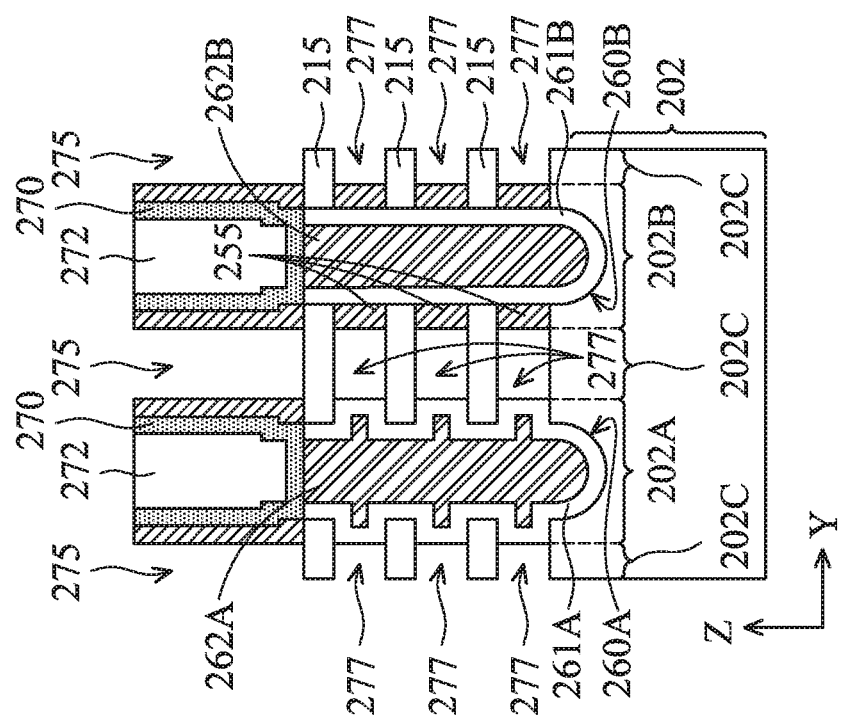
FIG. 16D
FIG. 16C

NANO-SHEET-BASED DEVICES WITH ASYMMETRIC SOURCE AND DRAIN CONFIGURATIONS

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

For example, nano-sheet-based devices have been introduced in an effort to improve gate control by increasing gate-channel coupling, reduce OFF-state current, and reduce short-channel effects (SCEs). Nano-sheet-based devices include a plurality of suspended channel layers stacked together to form the gate structure. The nano-sheet-based devices are compatible with conventional complementary metal-oxide-semiconductor (CMOS) processes, allowing them to be aggressively scaled down while maintaining gate control and mitigating SCEs. However, conventional nano-sheet-based devices may experience current crowding issues which degrades device performances (such as operational speeds). Therefore, although conventional nano-sheet-based devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 3C, 3D, 4C, 4D, 5C, 5D, 6C, 6D, 7C, 7D, 8C, 8D, 9C, 9D, 10C, 10D, 11C, 11D, 12C, 12D, 13C, 13D, 14C, 14D, 15C, 15D, 16C, 16D, 17C, 17D, 18C, and 18D are fragmentary diagrammatic views of a nano-sheet-based device, in portion or entirety, at various fabrication stages (such as those associated with the method in FIG. 1) according to various aspects of the present disclosure.

DETAILED DESCRIPTION

Figure 1:
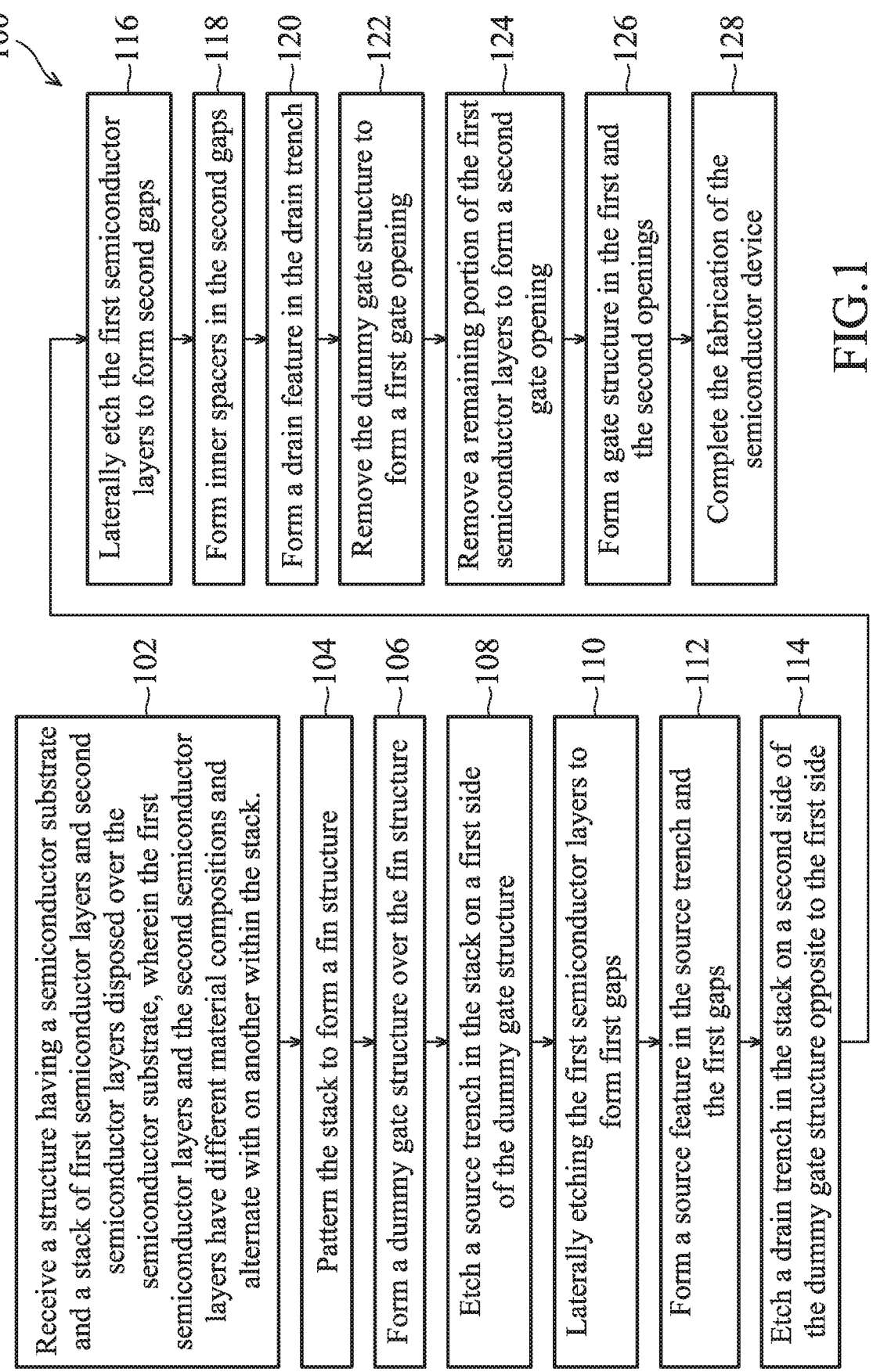
FIG. 1 is a flow chart of a method for fabricating a nano-sheet-based device according to various aspects of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nano-sheet-based transistors (or devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on). In some approach, inner spacers are formed between the source features and the gate structures as well as between the drain features and the gate structures. However, such a configuration may be prone to suffer from current crowding issues. Current crowding is a nonhomogeneous distribution of current density through a conductor or semiconductor (such as channel layers and epitaxial features of a nano-sheet-based transistor). Such nonhomogeneous distribution may lead to increased local resistances and ultimately degrade device performances. Accordingly, the present disclosure provides methods that mitigate this effect by forming source and drain sides with asymmetric configurations. Performance improvements are thus achieved. The nano-sheet based devices presented herein may be a complementary metal-oxide-semiconductor (CMOS) device, a p-type metal-oxide-semiconductor (pMOS) device, or an n-type metal-oxide-semiconductor (nMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figures 2A, 2B:
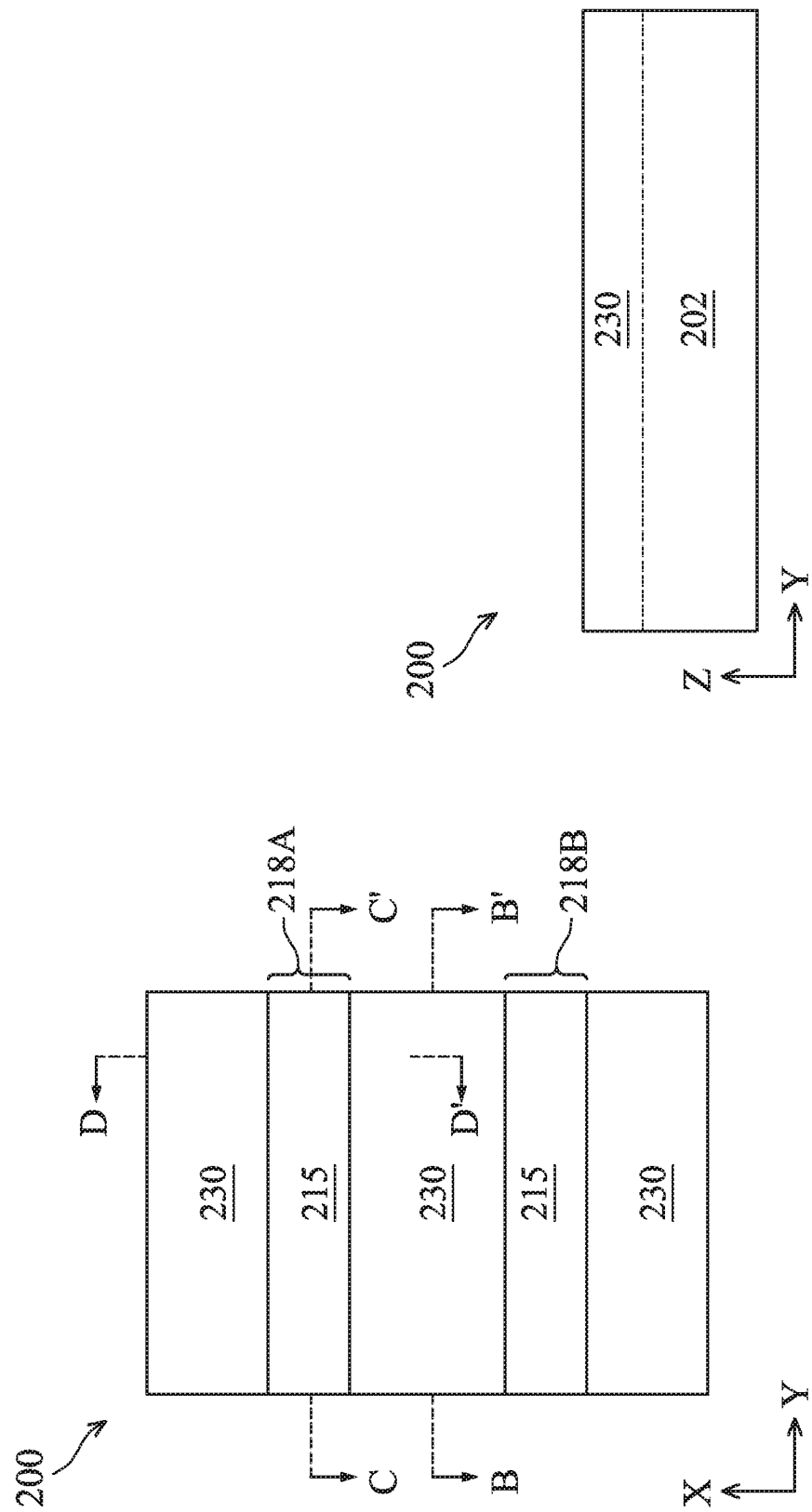
Figure 2D:
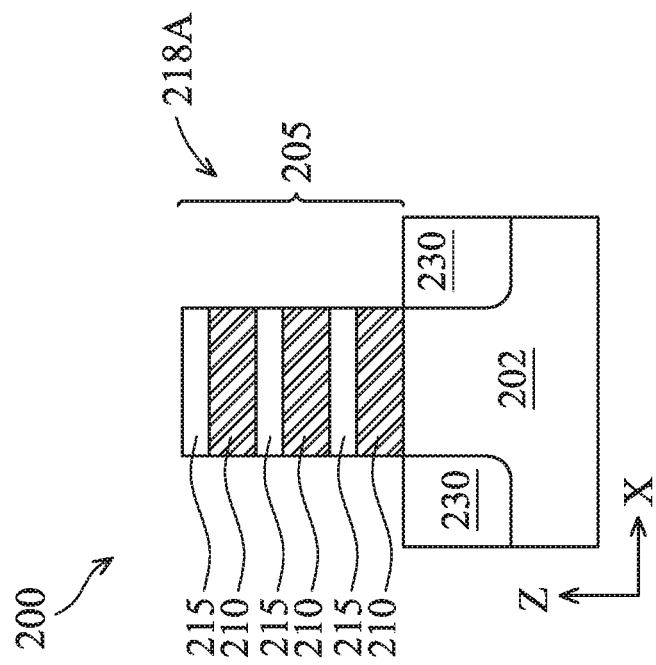
Figure 2C:
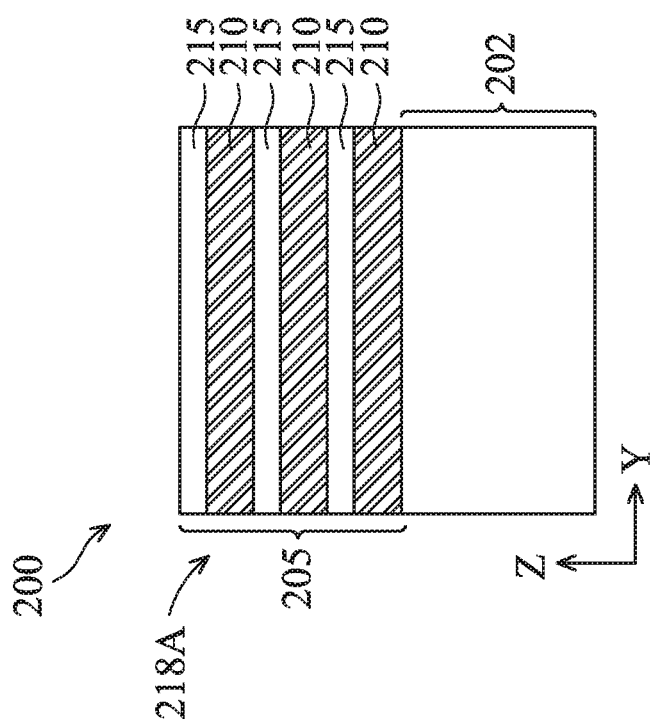

FIG. 1 is a flow chart of a method 100 for fabricating a nano-sheet-based device 200 according to various aspects of the present disclosure. FIG. 2A is a top view (e.g. in an X-Y plane) of an embodiment of a nano-sheet-based device 200 of the present disclosure constructed at a fabrication stage according to some embodiments of the present disclosure. FIGS. 2B, 2C-18C, and 2D-18D are cross sectional views (e.g. in a Y-Z plane or an X-Z plane) of the cross-sections illustrated by the lines B-B', C-C', and D-D' of FIG. 2A, respectively, of an embodiment of the nano-sheet-based device 200 of the present disclosure constructed at various fabrication stages according to some embodiments of the present disclosure.

Referring to blocks 102-104 of FIG. 1 and FIGS. 2A-2D, a semiconductor structure 200 is received. The semiconductor structure 200 includes a semiconductor substrate 202. In an embodiment, the semiconductor substrate 202 contains a semiconductor material, such as bulk silicon (Si). Alternatively or additionally, substrate 202 includes another elementary semiconductor material, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of device 200. The doped regions may be a p-type doped region (referred to hereinafter as a p-well), which can be configured for n-type transistors, or an n-type doped region (referred to hereinafter as an n-well), which can be configured for p-type transistors. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes semiconductor layers 210 and semiconductor layers 215 stacked vertically (e.g., along the Z-direction) in an interleaving or alternating configuration from a surface of substrate 202. In an embodiment, semiconductor layers 210 and semiconductor layers 215 are epitaxially grown in the depicted interleaving and alternating configuration. For example, a first layer of semiconductor layers 210 is epitaxially grown on substrate 202, a first layer of semiconductor layers 215 is epitaxially grown on the first layer of semiconductor layers 210, a second layer of semiconductor layers 210 is epitaxially grown on the first layer of semiconductor layers 215, and so on, until semiconductor layers stack 205 has a desired number of semiconductor layers 210 and semiconductor layers 215. In such embodiments, semiconductor layers 210 and semiconductor layers 215 can be referred to as epitaxial layers. In an embodiment, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

In an embodiment, the semiconductor layers 210 each has a substantially uniform thickness, and the semiconductor layers 215 each has a substantially uniform thickness. For example, semiconductor layer 210 may have a thickness of about 4 nm to about 15 nm. If the thickness is too small, such as less than 4 nm, there may not be sufficient space after removing the semiconductor layers 210 to form gate layers. If the thickness is too large, such as greater than 15 nm, the device dimensions may be unnecessarily large and hamper the effort of scaling down. For example, semiconductor layer 215 may have a thickness of about 3 nm to about 15 nm. If the thickness is too small, such as less than 3 nm, the device formed may have a large resistance and suffer degraded performances. If the thickness is too large, such as larger than 15 nm, gate control of middle portions of the channel layers may become too weak to ensure consistent performance.

A composition of semiconductor layers 210 is different than a composition of semiconductor layers 215, so as to achieve an etching selectivity during subsequent processing. In an embodiment, semiconductor layers 210 have a first etch rate in an etchant and semiconductor layers 215 have a second etch rate in the same etchant. The second etch rate is generally less than the first etch rate. Semiconductor layers 210 and semiconductor layers 215 include different materials, material components, constituent atomic percentages, constituent weight percentages, thicknesses, and/or characteristics to achieve desired etching selectivity during an etching process, such as an etching process implemented to form suspended channel layers in channel regions of device 200 (as described later). For example, in an embodiment, semiconductor layers 210 include silicon germanium and semiconductor layers 215 include silicon. The semiconductor layers 215 may be suitably composed to provide a channel region of the device 200. The present disclosure contemplates that semiconductor layers 210 and semiconductor layers 215 include any combination of semiconductor materials that can provide desired etching selectivity, etch rate differences, and/or desired performance characteristics (e.g., materials that maximize current flow), including any of the semiconductor materials disclosed herein.

As described further below, semiconductor layers 215 or portions thereof form channel regions of device 200. In an embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in device 200 having four channels. However, the present disclosure contemplates embodiments where semiconductor layer stack 205 includes more or fewer semiconductor layers, for example, depending on a number of channels desired for device 200 (e.g., a nano-sheet-based transistor) and/or design requirements of device 200. For example, semiconductor layer stack 205 can include two to ten semiconductor layers 210 and two to ten semiconductor layers 215.

Semiconductor layer stack 205 is patterned to form a fin 218A and a fin 218B (also referred to as fin structures, fin elements, etc.). Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a Y-direction, having a length defined in the Y-direction, a width defined in an X-direction, and a height defined in a Z-direction. In an embodiment, the fins 218A and 218B have a width of about 5 nm to about 80 nm. If the fin width is too small, such as smaller than 5 nm, there may not be sufficient space to form subsequent device features over the fins; if the fin width is too large, such as larger than 80 nm, the additional benefit provided may not justify the increased chip footprint.

In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In an embodiment, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In an embodiment, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In an embodiment, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over or in substrate 202 to isolate various regions, such as various device regions of device 200. For example, isolation features 230 surround a bottom portion of fins 218A, 218B, such that isolation features 230 separate and isolate fins 218A, 218B from each other. In an embodiment, isolation features 230 surround the substrate portion of fins 218A, 218B and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 and/or semiconductor layer stack 205 (for example, by using a dry etching process and/or a wet etching process) as discussed above in patterning of the fins 218A, 218B, and filling the trench with insulator material (for example, by using a CVD process or a spin-on glass process). A chemical mechanical polishing (CMP) process and/or etching processes may be performed to remove excessive insulator material and/or planarize a top surface of isolation features 230. In an embodiment, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In an embodiment, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Referring to block 106 of FIG. 1, FIGS. 3C-3D and FIGS. 4C-4D, gate stacks 240 are formed over portions of fins 218A, 218B and over isolation features 230. As described in more detail later in reference to block 122 of FIG. 1, the gate stacks 240 are subsequently removed, and may be referred to as dummy gate stacks 240. In an embodiment, as illustrated in FIGS. 3C-3D, a suitable dielectric material layer 238 is formed over the fins 218A, 218B and the isolation feature 230. The dielectric material layer 238 includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$— $Al_2O_3$) alloy, other suitable high-k dielectric materials, or combinations thereof. In an embodiment, the dielectric material layer 238 includes an interfacial layer (including, for example, silicon oxide) interposing between the fins 218A, 218B and a high-k dielectric layer disposed over the interfacial layer.

A suitable dummy gate electrode material layer 235 is then formed over the dielectric material layer 238. The dummy gate electrode material layer 235 may include, for example, polysilicon. In an embodiment, a hard mask material layer 232 is formed over the dummy gate material layer 235. The hard mask material layer 232 may include, for example, silicon nitride, silicon oxynitride, silicon carbon nitride, silicon carbide, silicon oxycarbide, spin-on glass (SOG), a low-k film, tetraethylorthosilicate (TEOS), plasma enhanced CVD oxide (PE-oxide), high-aspect-ratio-process (HARP) formed oxide, other suitable material, and/or combination thereof. Moreover, numerous other layers, for example, capping layers, interface layers, diffusion layers, barrier layers, hard mask layers, or combinations thereof may be formed below, between, or over the various layers described herein.

Dielectric material layer 238, dummy gate electrode material layer 235, and hard mask material layer 232 are formed by deposition processes, lithography processes, etching processes, other suitable processes, or combinations thereof. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

Turning to FIGS. 4C-4D, a lithography patterning and etching process is then performed to pattern the various layers to form dummy gate stacks 240. For example, dielectric material layer 238, the dummy gate electrode material layer 235, and the hard mask material 232 are each patterned to form the dummy gate stacks 240. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof. The dummy gate stacks 240 extend lengthwise in a direction that is different than (e.g., orthogonal to) the lengthwise direction of fins 218A, 218B. For example, dummy gate stacks 240 extend substantially parallel to one another and along the X-direction, having a length defined in the X-direction, a width defined in the Y-direction, and a height defined in the Z-direction. Dummy gate stacks 240 are disposed on portions of fins 218A, 218B (such as wrapping top surfaces and sidewall surfaces of fins 218A, 218B) and define source region 202A, drain region 202B, as well as define channel regions 202C between the source and drain regions. Dummy gate stacks 240 are disposed over top surfaces of respective channel regions 202C of fins 218A, 218B (e.g., in the Y-Z plane), such that dummy gate stacks 240 interpose respective source/drain regions 202A and 202B. In an embodiment, a width of the dummy gate stacks 240 along the Y direction defines a gate length of subsequently formed metal gate structures.

Figure 5D:
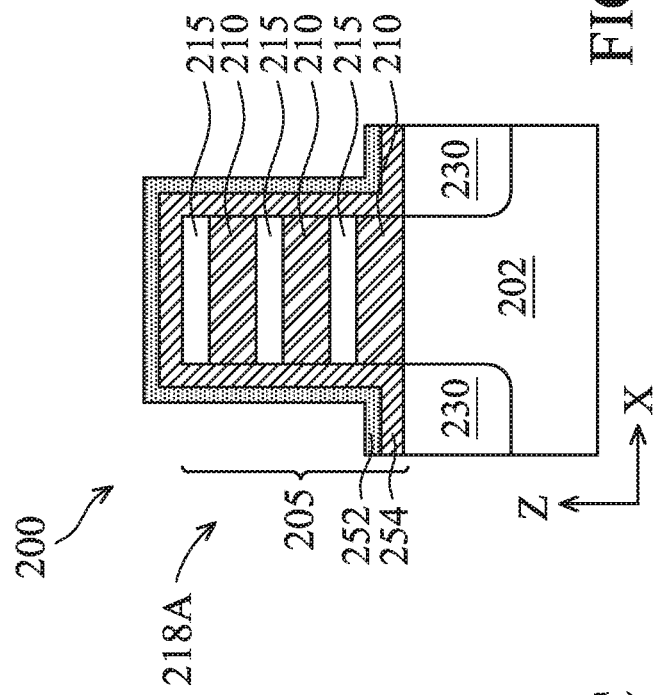
Figure 5C:
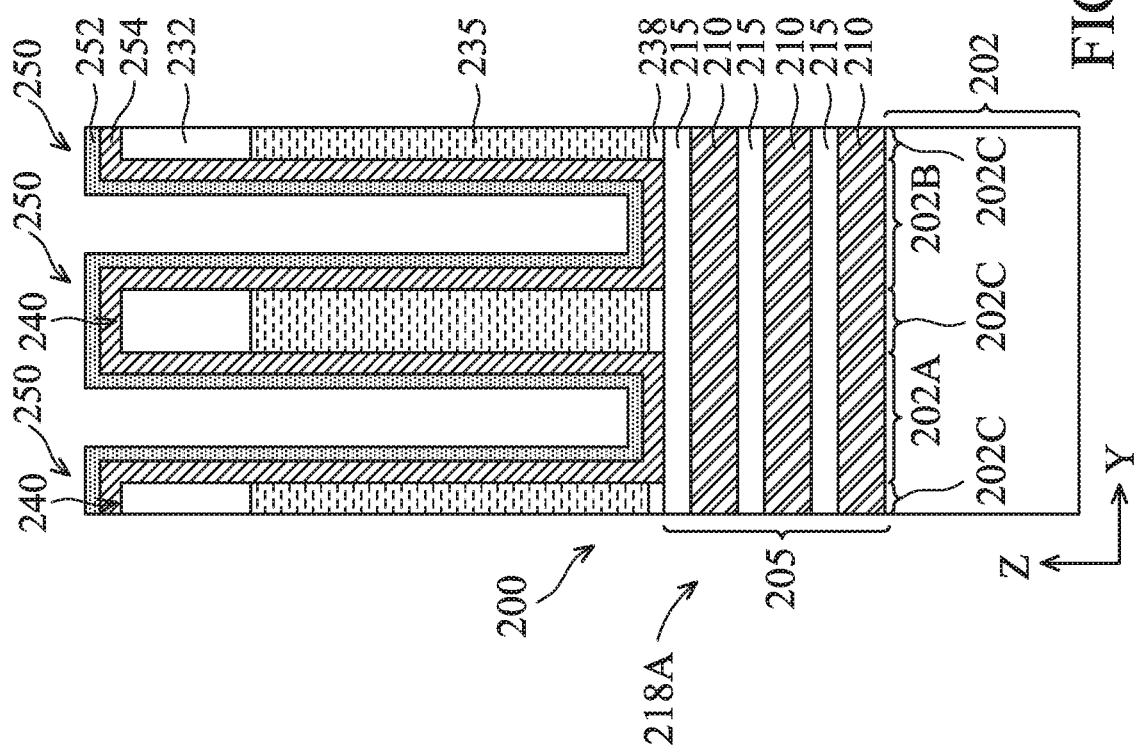

Turning to FIGS. 5C-5D, gate spacer layers 254 are formed adjacent to (e.g., along sidewalls and/or top surfaces of) respective dummy gate stacks 240 by any suitable process. The gate spacer layers 254 are subsequently processed into gate spacers, as described later. The gate spacer layers 254 include a dielectric material. The dielectric material can include silicon, oxygen, carbon, nitrogen, other suitable material, or combinations thereof (e.g., silicon oxide, silicon nitride, silicon oxynitride, silicon carbide, silicon carbonitride, silicon oxycarbide, silicon oxycarbon nitride. For example, a dielectric layer including silicon and nitrogen, such as a silicon nitride layer, can be deposited over dummy gate stacks 240 to form the gate spacer layers 254. In an embodiment, the gate spacer layers 254 include a multi-layer structure, such as a first dielectric layer that includes silicon nitride and a second dielectric layer that includes silicon oxide. In an embodiment, more than one set of spacer layers, such as seal spacer layers, offset spacer layers, sacrificial spacer layers, dummy spacer layers, and/or main spacer layers, are formed adjacent to dummy gate stacks 240. In such implementations, the various sets of spacer layers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited to form a second spacer set adjacent to the first spacer set. Moreover, a mask layer 252 is formed over the gate spacer layers 254. In some embodiments, the mask layer 252 may be formed conformally. The mask layer 252 may have any suitable etch mask layer materials. In an embodiment, the mask layer 252 is omitted.

Figure 6D:
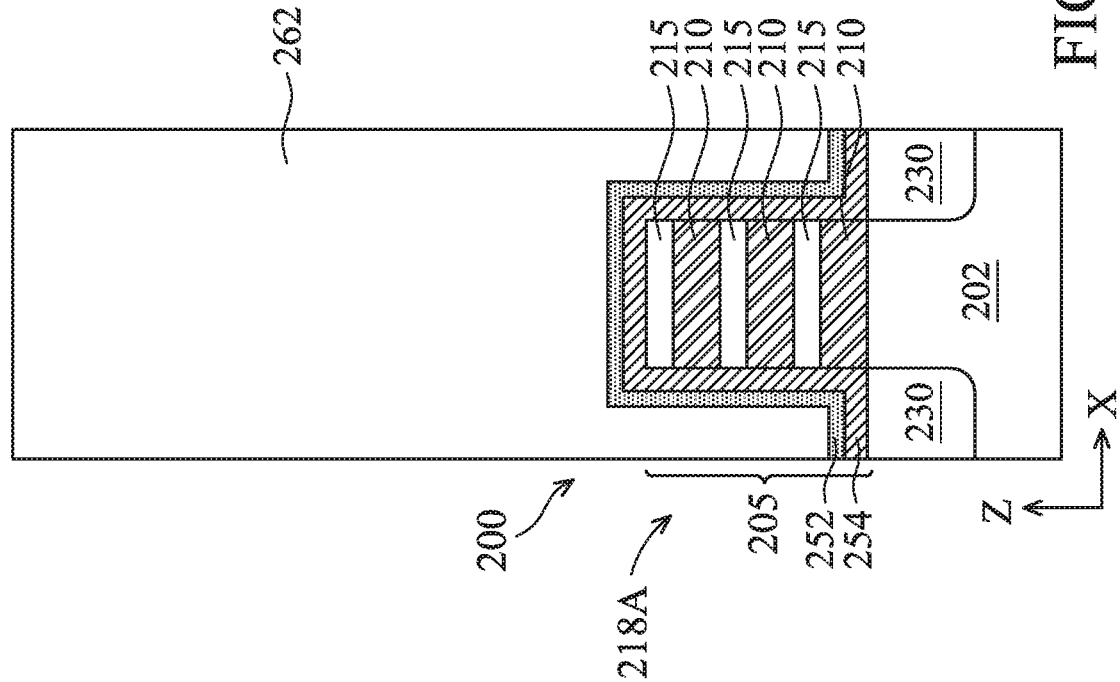
Figure 6C:
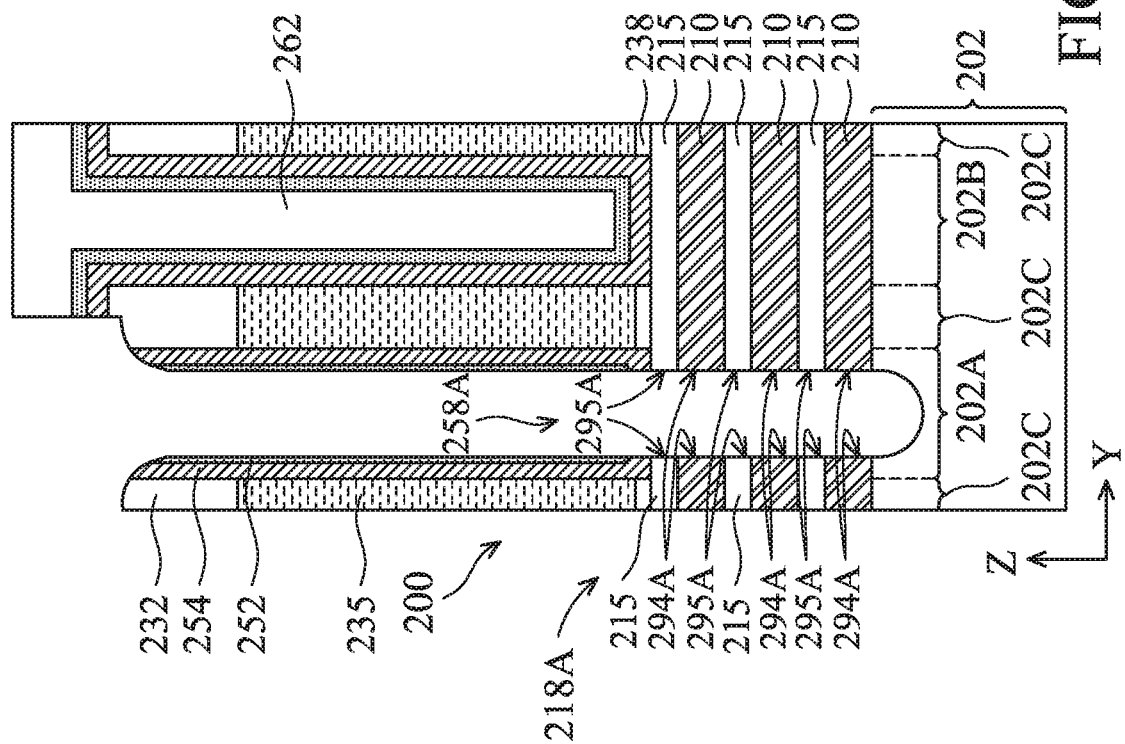

Referring to block 108 of FIG. 1 and FIGS. 6C-6D, a mask layer 262 is formed over the mask layer 252 to cover at least the drain region 202B of the fins 218A, 218B. Meanwhile, the mask layer 262 leaves the source region 202A exposed. The mask layer 262 may include any suitable materials and be formed using any suitable methods. For example, the mask layer 262 may be a photoresist layer of any suitable photoresist materials. In an embodiment, the mask layer 252 may be patterned through the openings of the mask layer 262. For example, the mask layer 252 in the source region 202A may be etched away during the patterning process. Thereafter, the patterned mask layer 252 serves as the etch mask for etching the source trenches.

The exposed source region 202A of fins 218A, 218B (such as those not covered by the etched mask layer 252) are at least partially removed to form source trenches (recesses) 258A. As described above, the fins 218A, 218B include semiconductor layer stack portion and a substrate portion. The source trenches 258A refer to the openings in the semiconductor layer stack 205 and may extend into the substrate 202. For example, an etching process completely removes semiconductor layer stack 205 in source regions 202A of fin 218A and further etches into the substrate 202, such that a bottom surface of the source/drain trenches 258A extend below a top surface of the substrate 202. For another example, the source trenches 258A removed semiconductor layer stack 205 in source regions 202A but do not etch the substrate 202. Accordingly, the source trenches 258A have bottom surfaces defined by substrate 202. For yet another example, the etching process removes some, but not all, of semiconductor layer stack 205, such that source trenches 258A have bottoms defined by semiconductor layer 210, semiconductor layer 215, or portions thereof in source regions 202A.

As a result of the source trenches formation process, the semiconductor layers 210 each has a sidewall 294A, and the semiconductor layers 215 each has a sidewall 295A. In an embodiment, the sidewall 294A aligns with the sidewall 295A. The etching process to form the source trenches 258A can include a dry etching process, a wet etching process, other suitable etching process, or combinations thereof. In an embodiment, the etching process is a multi-step etch process. For example, the etching process may alternate etchants to separately and alternately remove semiconductor layers 210 and semiconductor layers 215. In an embodiment, parameters of the etching process are configured to selectively etch semiconductor layer stack 205 with minimal etching of dummy gate stacks 240 and gate spacers 254 and isolation features 230. Moreover, the source trenches formation process also results portions of the gate spacer layers 254 to be removed. The remaining portions of the gate spacer layers 254 become the gate spacer 254 for the dummy gate stack 240.

Figure 7C:
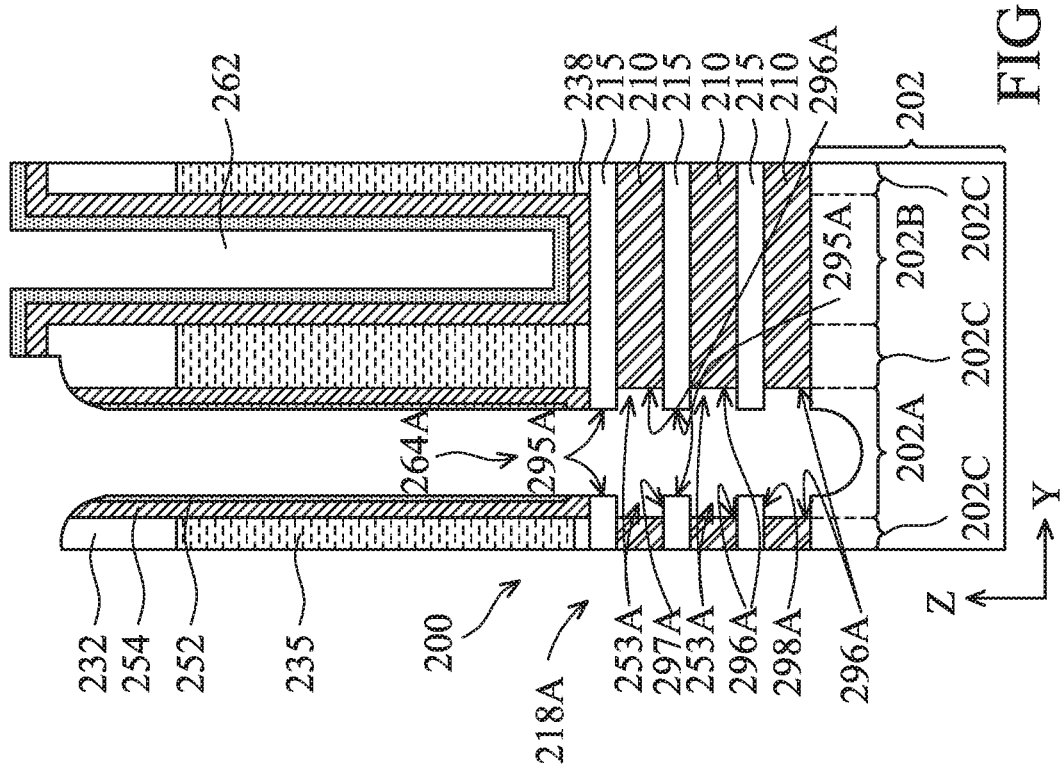
Figure 7D:
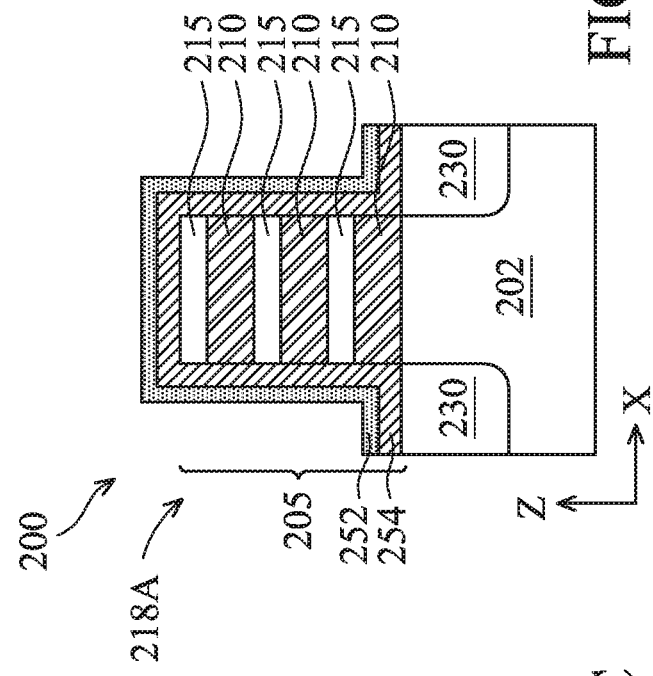

Referring to block 110 of FIG. 1 and FIGS. 7C and 7D, gaps 253A are formed between end portions of vertically adjacent semiconductor layers 215 by removing end portions of the semiconductor layers 210 therebetween using a suitable removal process. For example, a lateral etching process is performed that selectively etches (e.g., along the Y-direction) semiconductor layers 210 exposed in the source trenches 258A while minimally etches (or does not etch) semiconductor layers 215. Accordingly, gaps 253A are formed between semiconductor layers 215 as well as between semiconductor layers 215 and substrate 202. In an embodiment, the etching process is a dry etching process, a wet etching process, other suitable etching process, or combinations thereof. The gaps 253A and the source trench 258A collectively form extended source trench 264A. The etched semiconductor layers 210 each has a sidewall 296A that is exposed in the gaps 253A. As indicated above, the semiconductor layers 215 are minimally etched (or not etched) due to their better etching resistance to the etching process. Therefore, the etched semiconductor layers 215 each has the same sidewall surfaces 295A as before the lateral etching process. The sidewall surfaces 296A are offset from and do not align with the sidewall surfaces 295A. Moreover, the semiconductor layers 215 each has a top surface 297A and a bottom surface 298A that are exposed in the extended source trench 264A. These segments of surfaces at least partially determine the profile of the epitaxial layers subsequently formed.

Figure 8D:
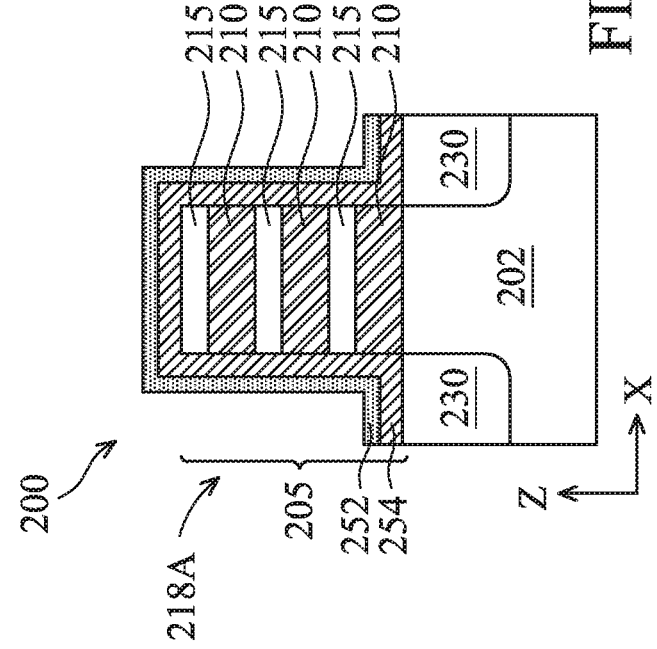
Figure 8C:
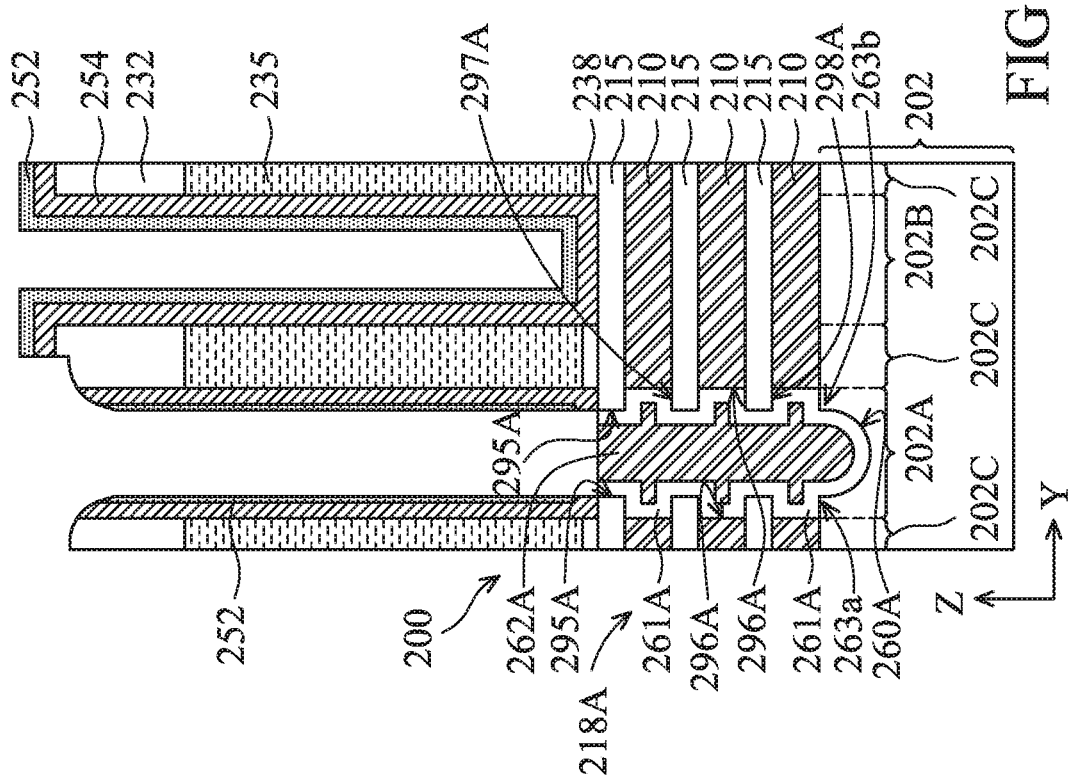

Referring to block 112 of FIG. 1 and FIGS. 8C and 8D, epitaxial source features 260A are formed in the extended source trench 264A. For example, a semiconductor material is epitaxially grown from the exposed portions of substrate 202 and from the exposed portions of semiconductor layers 215, forming epitaxial source feature 260A in the source regions 202A. In an embodiment, the epitaxial source feature 260A includes more than one layer. For example, the epitaxial source feature 260A may include a first epitaxial source layer 261A over the exposed substrate 202 and on top, bottom, and sidewall surfaces of the exposed portions of semiconductor layers 215. The epitaxial source layer 261A at least partially fills the extended source trench 264A. The epitaxial source layer 261A directly contacts the sidewall surfaces 295A of the semiconductor layers 215, as well as directly contacts the sidewall surfaces 296A of the semiconductor layers 210. As indicated above, the sidewall surfaces 295A and 296A are offset from and do not align with each other. Moreover, the epitaxial source layer 261A further directly contacts the top and bottom surfaces of each of the semiconductor layers 215 (such as surfaces 297A and 298A). As described in detail later, these interfaces (such as surfaces 297A and 298A) serve as additional pathways for charge movement in operation and mitigate current crowding issues.

Accordingly, the interface between the epitaxial source layer 261A and the semiconductor layer stack 205 includes multiple vertical (or close-to-vertical) segments (such as sidewall surfaces 295A and 296A) that are offset from and do not align with each other, as well as horizontal (or close-to-horizontal) segments (such as surface 297A and the surface 298A) that extend approximately perpendicularly to the sidewall surfaces 295A and 296A. In other words, the interface between the epitaxial source layer 261A and the semiconductor stack 205 has one or more sections that have a profile that resembles the shape of the letter "S". While the figures depict the segments of the "S" as vertical or horizontal, they may instead be of any orientations.

In an embodiment, the epitaxial source feature 260A may further include an epitaxial source layer 262A grown from the epitaxial source layer 261A. For example, the epitaxial source layer 262A connects the two opposing surfaces of the epitaxial source layers 261A such that it fills the remaining space of the extended source trench 264A. In an embodiment, the epitaxial source layer 262A has a top surface extending along a top surface of the epitaxial source layer 261A. Because the epitaxial source layer 262A shares interfaces with the epitaxial source layer 261A, the epitaxial source layer 262A also has two opposing surfaces that each has sections resembling the shape of the letter "S". In an embodiment, the epitaxial source layer 261A and the epitaxial layer 262A have a top surface that extends along a top surface of the semiconductor layer stack 205. However, the epitaxial source layer 261A and the epitaxial layer 262A may have a top surface that extends above or below the top surface of the semiconductor layer stack 205, depending on the design requirements.

In an embodiment, the epitaxial source layer 261A may have a uniform (or substantially uniform) thickness throughout its profile. Accordingly, the shape of the layer resembles the shape of the surfaces. For example, as illustrated in FIG. 8C, the epitaxial source layer 261A includes two opposing portions 263a and 263b each extending upwards from the substrate 202 and each having a layer profile that resembles the shape of the letter "S". In some embodiments, the epitaxial source layer 261A may have a thickness of about 2 nm to about 6 nm. If the thickness is too small, such as less than 2 nm, the effectiveness of the epitaxial layer 261A with respect to protecting the inner layers (such as epitaxial layers 262A described below) may be insufficient. This aspect is described in detail later. On the other hand, a large layer thickness for the epitaxial layers 261A necessarily leads to a reduced thickness (or volume) for the epitaxial layers 262 formed in the same extended source/drain trenches 264A. If the thickness is too large, such as larger than 6 nm, the volume of the epitaxial source layers 262A may be too small. In some embodiments, the epitaxial source layers 262A serve as the main charge carrier provider and have more charge carriers than the epitaxial source layers 261A, or have charge carriers having higher mobility than those in the epitaxial source layers 261A. Accordingly, the unnecessarily large thickness of the epitaxial layer 261A ultimately causes the reduction of the amount or mobility of the charge carriers, thereby reducing the device performance (such as operation speeds).

In some embodiments, the epitaxial source layers 261A and the semiconductor layers 210 are configured to achieve an etching selectivity during a subsequent etching process. Accordingly, they may comprise different materials or different material compositions. For example, in the depicted embodiment, the semiconductor layers 210 may include silicon germanium (SiGe) while the epitaxial source layers 261A may include silicon (Si). In some embodiments, the epitaxial source layers 261A and 262A form a portion of a p-type transistor. The presence of the Si-based epitaxial source layer 261A ensures the integrity of the epitaxial source features 260A to not be compromised in subsequent processing. More specifically, as described in more detail later, the epitaxial source layers 261A are formed directly on or in close proximity with the semiconductor layers 210 (such as separated only by a barrier layer). In other words, no inner spacers are formed that interpose between the semiconductor layers 210 and the epitaxial source layers 261A. Accordingly, without the described etching selectivity, etching processes that targets removal of semiconductor layers 210 (such as that of the wire release process described later with respect to block 124 of FIG. 1) will unintendedly compromise the integrity of the epitaxial source layers 261A. Where the epitaxial source layers 262A includes a similar material, the etching processes may further damage the epitaxial source layers 262A as well.

By contrast, the etching selectivity between the semiconductor layers 210 and the epitaxial source layers 261A ensures that the epitaxial source layer 261A is not (or minimally) etched during such subsequent processing. Moreover, such etching selectivity enables the epitaxial source layers 262A (or other inner epitaxial layers) to have more versatile material choices. The epitaxial layers 262A have larger thicknesses (or volumes) than the epitaxial source layers 261A. They may also include larger amounts of dopants or dopants with higher mobilities than those in the epitaxial source layers 261A. In other words, the functionality of the epitaxial source features 260A are predominantly provided by the epitaxial source layers 262A. Accordingly, a wide material selection for the epitaxial source layers 262A may aid the design of the device and improve the device performances (such as operation speeds). For example, SiGe is not only a common material for the semiconductor layers 210, but also a common epitaxial source material for p-type transistors due to the large hole mobility therein. The configurations described here enables the epitaxial source layers 262A to adopt SiGe without the risk of being damaged during subsequent SiGe-etching processes that forms the suspended channel layers. In absence of the etching selectivity described above, the epitaxial source layers 262A may not select a SiGe composition similar to that of the semiconductor layers 210. Such restrictions are eliminated here as these two SiGe layers are separated from each other by the Si material of the epitaxial source layer 261A. Therefore, the etching selectivity between SiGe and Si ensures that the etching process be stopped at the interface between the semiconductor layer 210 and the epitaxial source layer 261A, without reaching the epitaxial source layer 262A.

In this embodiment, the epitaxial source layers 261A includes Si, and the epitaxial source layers 262A include SiGe. In other words, there exists an etching selectivity between the epitaxial source layers 261A and the epitaxial source layers 262A. In other embodiments, however, the epitaxial source layers 261A and the epitaxial layers 262A may include the same or similar materials and have no etching selectivity between them. For example, in some embodiments, the semiconductor layers 210 may include Si, while both the epitaxial source layers 261A and the epitaxial source drain layers 262 may include SiGe.

In some embodiments, the epitaxial source layers 261A and 262A may form a portion of an n-type transistor. Similar to p-type transistors, an etching selectivity between the epitaxial source layers 261A and the semiconductor layers 210 ensures the integrity of the epitaxial source layers. In some embodiments, the semiconductor layers 210 includes SiGe. In such embodiments, epitaxial source layers 261A and epitaxial source layers 262 may both include Si as the epitaxial material. In some other embodiments, the semiconductor layers 210 may include Si. Because Si is a common epitaxial material for the n-type devices, sometimes, it may be beneficial to configure the source layers 262A (i.e. the major charge carrier provider) to include Si. In such embodiments, the epitaxial source layers 261A may include a different material (such as SiGe) in order to provide an etch-stop mechanism to avoid damages to the epitaxial source layers 261A and 262A during the etching of the semiconductor layers 210. In other words, there exists an etching selectivity between the epitaxial source layers 261A and the semiconductor layer 210, and an etching selectivity between the epitaxial source layers 261A and the epitaxial source layers 262A.

The epitaxial source feature 260A (including the epitaxial source layer 261A and the epitaxial layer 262A) may be deposited using any suitable epitaxy processes include CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Moreover, the epitaxial source features 260A may be doped with p-type dopants or n-type dopants depending on the type of transistors they form and the selection criteria described above. For example, in the depicted embodiments (where the semiconductor layers 210 include SiGe), the epitaxial source layer 261A for a p-type transistor may include Si and can be doped with boron (B) or gallium (Ga), other p-type dopant, or combinations thereof (for example, forming Si:B epitaxial source layer or Si:Ga epitaxial source layer). Meanwhile, the epitaxial source layers 262A may include SiGe or Ge and can be doped with boron (B) or gallium (Ga), other p-type dopant, or combinations thereof (for example, forming Si:Ge:B epitaxial source layer, Si:Ge:Ga epitaxial source layer, Ge:B epitaxial layers, or Ge:Ga epitaxial source layer). For another example where the semiconductor layers 210 include SiGe, epitaxial source layer 261A and epitaxial source layers 262A for an n-type transistor may include both Si and can be doped with carbon, phosphorous, arsenic, other n-type dopant, or combinations thereof (for example, forming Si:C epitaxial source layers, Si:P epitaxial source layers, Si:As epitaxial source layers, or Si:C:P epitaxial source layers).

Epitaxial source layers 261A and 262A may include the same or different dopant concentrations. In an embodiment, epitaxial source features 260A (including epitaxial source layers 261A, epitaxial source layers 262A, or both) may include materials or dopants that achieve desired tensile stress or compressive stress in respective channel regions of the device. In an embodiment, epitaxial source features 260A are doped during deposition by adding impurities to a source material of the epitaxy process (i.e., in-situ). In an embodiment, epitaxial source features 260A are doped by an ion implantation process subsequent to a deposition process. In an embodiment, annealing processes (e.g., rapid thermal annealing (RTA) and/or laser annealing) are performed to activate dopants in epitaxial source features 260A.

Figure 9C:
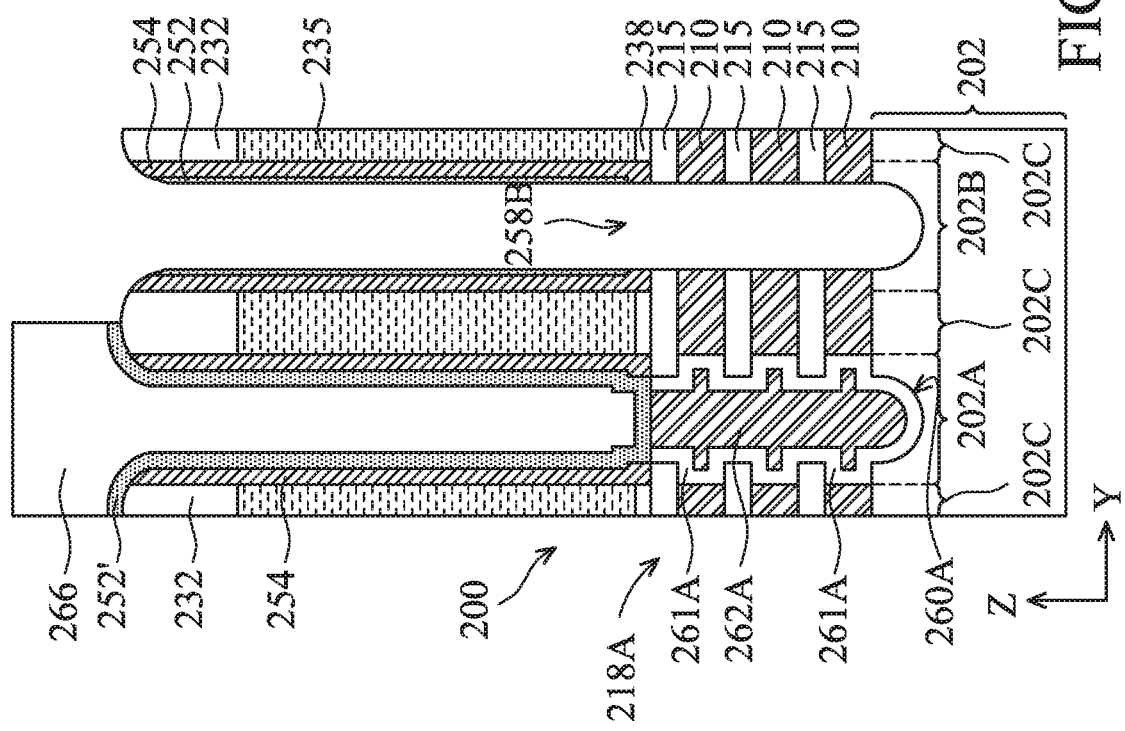
Figure 9D:
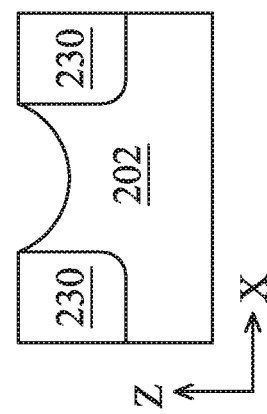

Referring to block 114 of FIG. 1 and FIGS. 9C and 9D, a mask layer 252' is formed over the epitaxial source features 260A, such that the mask layer 252' covers the top surfaces of the epitaxial source layers 261A and 262A, the top and sidewall surfaces of the gate spacers 254, and the top surfaces of the hard mask layers 232. The mask layer 252' protects the source features 260A in subsequent etching processes. The mask layer 252' may be formed by any suitable methods. In an embodiment, the remaining portions of the mask layer 252 (see FIG. 8C) is first removed using an appropriate method, and a re-deposition process is employed to form the mask layer 252' such that it covers the exposed top surfaces.

A mask layer 266 (such as a photoresist layer) is formed over at least the source region 202A of the device, for example, over the mask layer 252'. The mask layer 266 is patterned to provide an opening that exposes the drain region 202B. Subsequently, an etching process is employed to form patterned mask layer 252 and subsequently to form drain trenches 258B in the drain region 202B, similar to the etching process described above with respect to block 108 of FIG. 1 and FIGS. 6C-6D. Accordingly, in an embodiment, the drain trenches 258B exposes sidewall surfaces of the semiconductor layers 210 and 215, and extends into the substrate 202 in the drain region 202B.

Figure 10D:
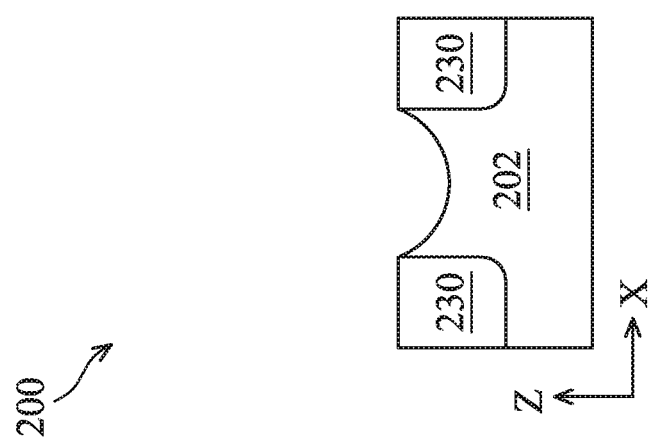
Figure 10C:
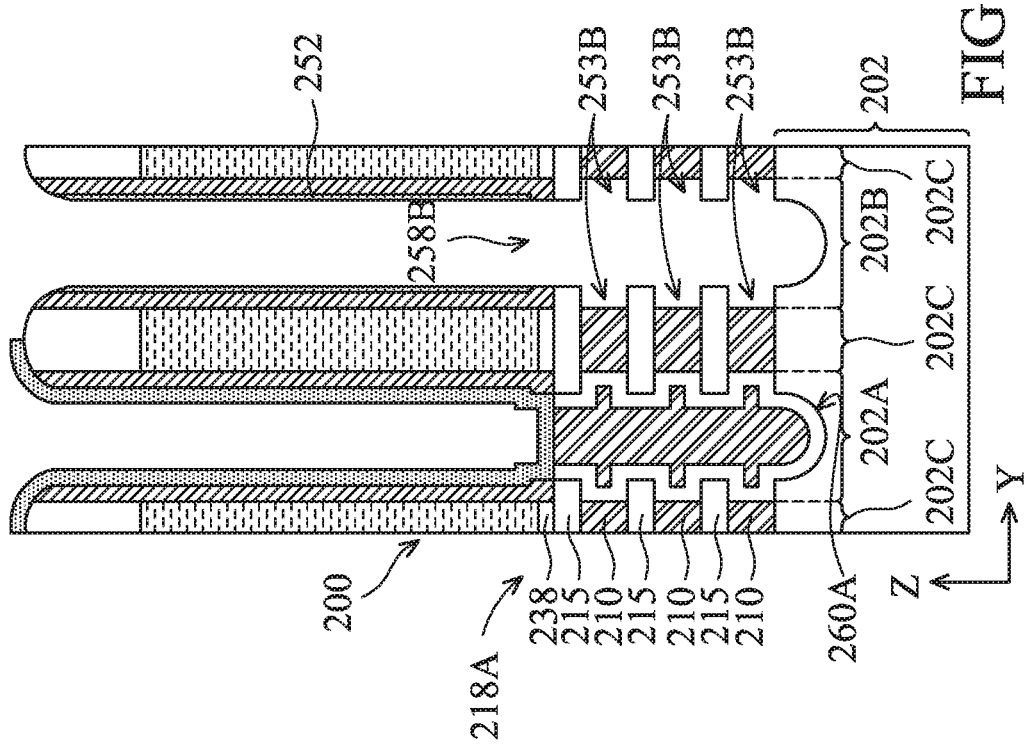

Referring to block 116 of FIG. 1 and FIGS. 10C and 10D, a lateral etching process remove portions of the semiconductor layers 210 thereby forming gaps 253B between vertically adjacent end portions of the semiconductor layer 215. This process resembles the lateral etching process described above with respect to block 110 of FIG. 1 and FIGS. 7C and 7D. Moreover, the gaps 253B resemble the gaps 253A described above.

Figure 11C:
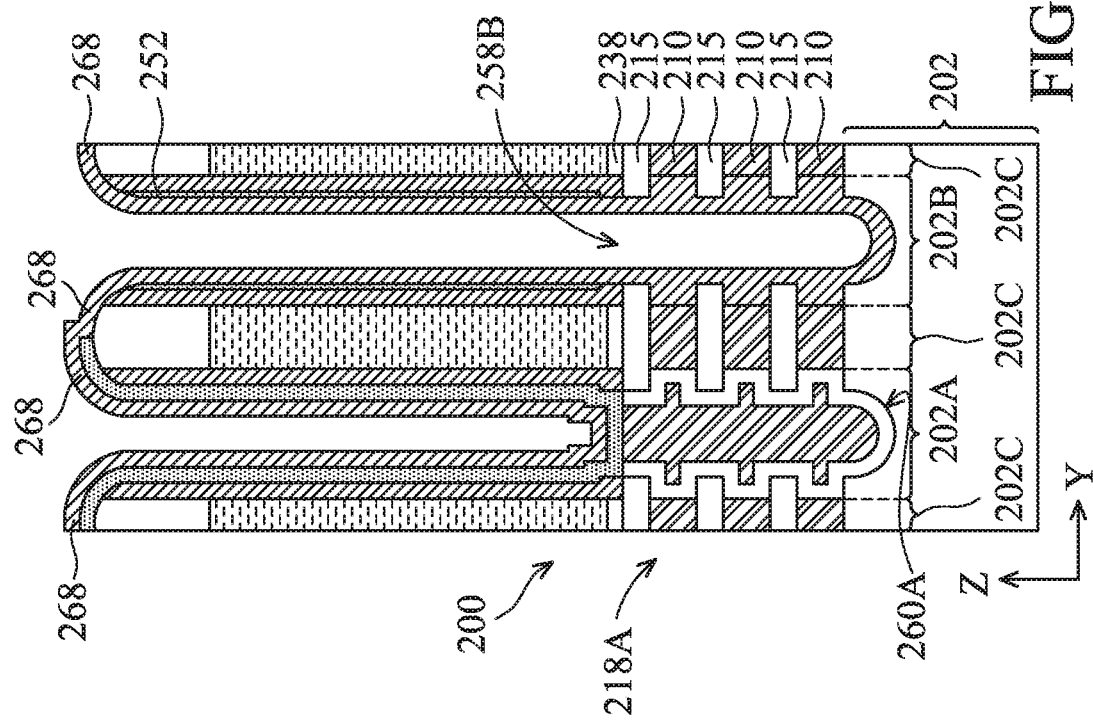
Figure 11D:
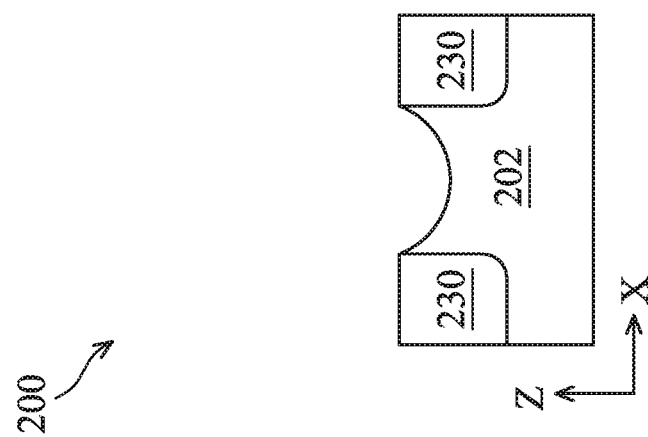

Referring to block 118 of FIG. 1 and FIGS. 11C and 11D, a deposition process then forms a spacer material layer 268 over the exposed surfaces. For example, the spacer material layer 268 is formed on the mask layer 252' in the source regions 202A, and on the mask layer 252, the hard mask layer 232, the exposed substrate 202, and on the semiconductor layers 210 and 215 in the drain regions 202B. Particularly, the spacer material layer 268 fills the gaps 253B (see FIG. 10C) between vertically adjacent end portions of the semiconductor layers 215 and between the semiconductor layer 215 and the substrate 202, such that the spacer material layer 268 directly contacts the sidewall surfaces of the semiconductor layers 210 as well as the top and bottom surfaces of the end portions of the semiconductor layers 215. In an embodiment, the deposition process employs CVD, PVD, ALD, HDPCVD, MOCVD, RPCVD, PECVD, LPCVD, ALCVD, APCVD, plating, other suitable methods, or combinations thereof. The spacer material layer 268 partially (and, in some embodiments, completely) fills the drain trenches 258B. While FIG. 11C illustrate the spacer material layer 268 as having a U-shaped profile, it may instead have any suitable profiles.

The spacer material layer 268 includes a dielectric material that includes, for example, silicon, oxygen, carbon, nitrogen, other suitable material, or combinations thereof (for example, silicon oxide, silicon nitride, silicon oxynitride, silicon carbide, or silicon oxycarbonitride). In an embodiment, the dielectric material includes a low-k dielectric material, such as those described herein. In an embodiment, dopants (for example, p-type dopants, n-type dopants, or combinations thereof) are introduced into the dielectric material, such that the spacer material layer 268 includes a doped dielectric material.

Figure 12D:
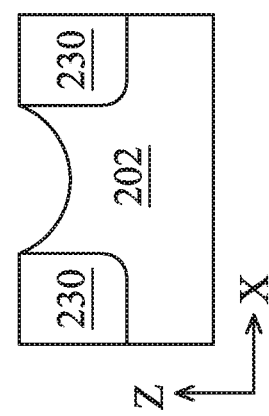
Figure 12C:
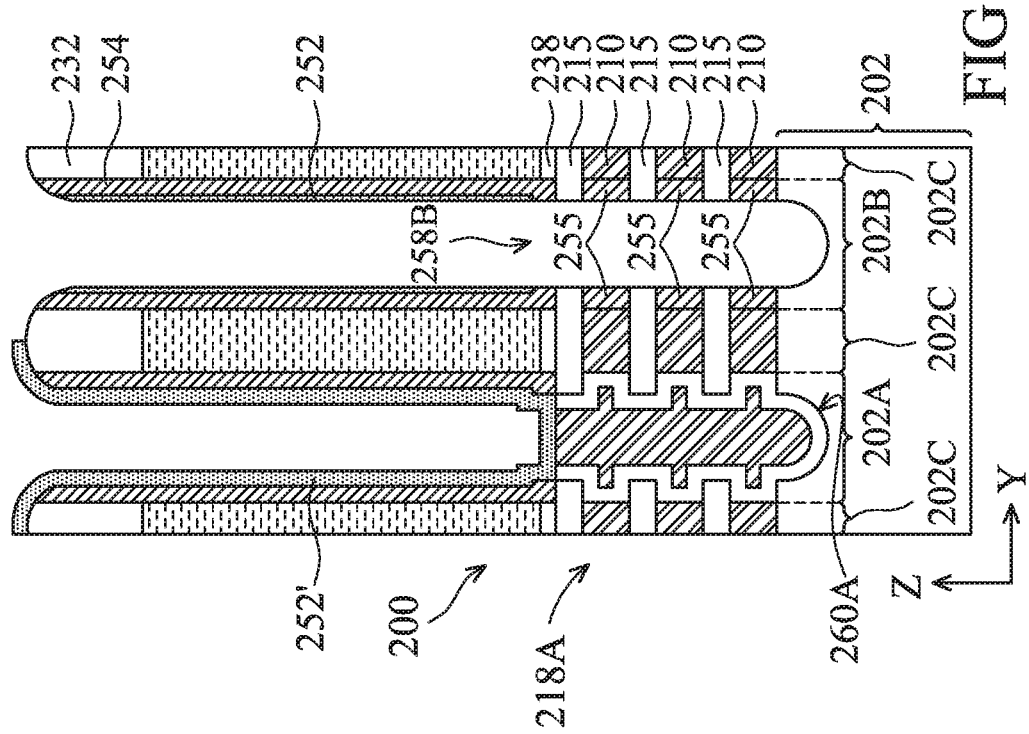

Still referring to block 118 of FIG. 1 and further referring to FIGS. 12C and 12D, an etch-back process is employed to remove portions of the spacer material layer 268 thereby forming inner spacers 255. In an embodiment, there is minimal (to no) etching of semiconductor layers 215, dummy gate stacks 240, and gate spacers 254 during the etching back of the spacer material layer 268. In an embodiment, the spacer material layer 268 outside the gaps 253B is removed completely, such that the top surfaces of the hard mask layer 232 and gate spacer layer 254, the top and sidewall surfaces of the thinned mask layer 252, as well as the sidewall surfaces of the semiconductor layer 215 are exposed. Moreover, the exposed sidewall surfaces of the inner spacers 255 align with the sidewall surfaces of the semiconductor layers 215 to form a continuous and substantially straight sidewall surface. In an embodiment, the spacer material layer (and thus inner spacers 255) includes a material that is different than a material of semiconductor layers 215 and a material of gate spacers 254 to achieve desired etching selectivity during the etch-back process. In an embodiment, the inner spacers 255 protects the epitaxial drain features 260B (FIG. 13C) in the subsequent channel release processes, and also serve to reduce the parasitic capacitances. The inner spacers 255 have a thickness along the Z-direction that is largely determined by the thickness of the semiconductor layers 210. Accordingly, the inner spacers 255 may have a thickness of about 3 nm to about 15 nm. Moreover, the inner spacers 255 have a width along the Y-direction of about 2 nm to about 10 nm. If the width is too small, such as less than 2 nm, the inner spacers 255 may not sufficiently protect the epitaxial drain features 260B in subsequently etching processes; and the effect of the inner spacers 255 in reducing the parasitic capacitance may be reduced. If the width is too large, such as greater than 10 nm, the additional benefit it brings may not be worth the additional chip footprint required.

Referring to block 120 of FIG. 1 and FIGS. 13C and 13D, an epitaxial drain feature 260B is formed in the drain trench 258B. The drain feature 260B is formed using methods that are generally similar to those described above for epitaxial source feature 260A with respect to block 112 of FIG. 1 and FIGS. 8C and 8D. The epitaxial drain features 260B differs from the epitaxial source features 260A in that portions of the epitaxial features 260B do not interface with the semiconductor layers 210. Rather, inner spacers 255 interpose between sidewall surfaces of the semiconductor layers 210 and the epitaxial source features 260B. In an embodiment, the epitaxial drain features 260B each include more than one layer. For example, as illustrated in FIG. 13C, the epitaxial source feature 260B includes an epitaxial drain layer 261B and an epitaxial drain layer 262B. The epitaxial drain layer 261B directly interfaces with the inner spacers 255 and the semiconductor layers 215. And the epitaxial drain layer 262B are over and between opposing segments of the epitaxial drain layer 261B. As indicated above, the sidewall surfaces of the semiconductor layers 215 and the inner spacers 255 align with each other to form a continuous and substantially straight sidewall surface. Accordingly, the epitaxial drain layer 261B has a continuous and substantially straight sidewall surface (such as a continuous and substantially straight interface with the semiconductor layers 215 and inner spacers 255). In an embodiment, the epitaxial drain layer 261B is a conformal layer. In other words, the epitaxial drain layer 261B has uniform thickness throughout its profile. Accordingly, the epitaxial drain layer 262B also has a substantially straight sidewall surface. Moreover, the epitaxial drain layer 262B has a hexagonal profile in an X-Z plane as illustrated in FIG. 13D.

In an embodiment, the epitaxial drain layer 261B and the epitaxial drain layer 262B have a top surface that extends along a top surface of the semiconductor layer stack 205. However, the epitaxial drain layer 261B and the epitaxial drain layer 262B may have a top surface that extends above or below the top surface of the semiconductor layer stack 205, depending on the design requirements. The epitaxial drain layer 261B include similar materials as the epitaxial source layers 261A or as the epitaxial source layers 262A. The epitaxial drain layers may also include similar materials as the epitaxial source layers 261A or as the epitaxial source layers 262A. In other words, there is no restriction to the materials for the epitaxial drain layers 261B or 262B similar to those for the epitaxial source layers 261A and 262A. This is because the protection scheme for the epitaxial source features have been fulfilled by the use of inner spacers 255. Accordingly, the material selections for the epitaxial drain layers are wider. In some embodiments, the epitaxial drain layers 261B and 262B may include the same or similar materials. The epitaxial drain layers 261B and 262B may be deposited using similar methods to those described above with respect to the epitaxial source feature 260A.

Moreover, the epitaxial drain features 260B (including the epitaxial drain layer 261B and the epitaxial drain layer 262B) are doped with n-type or p-type dopants. For example, epitaxial drain layer 261B and 262B for an n-type transistor may include Si, and can be doped with carbon, phosphorous, arsenic, other n-type dopant, or combinations thereof (for example, forming Si:C epitaxial drain layers, Si:P epitaxial drain layers, Si:As epitaxial drain layers, or Si:C:P epitaxial source features). For another example, epitaxial drain layer 261B and 262B for a p-type transistor may include SiGe and can be doped with boron (B) or gallium (Ga), other p-type dopant, or combinations thereof (for example, forming Si:Ge:B epitaxial source layer or Si:Ge:Ga epitaxial source layer). Epitaxial drain layers 261B and 262B may include the same or dopant concentrations. In some embodiments, the epitaxial drain features 260B includes only one epitaxial material layer. In an embodiment, epitaxial source features 260 include materials or dopants that achieve desired tensile stress or compressive stress in respective channel regions of the device. After forming the epitaxial drain features 260B, hard mask layers 252 and 252' are removed by any suitable methods to expose the top surfaces of the epitaxial source features 260A and epitaxial drain features 260B as well as the sidewall surfaces of gate spacers 254.

Referring to block 122 of FIG. 1 and FIGS. 14C and 14D, a contact etch stop layer (CESL) 270 is formed on sidewall surfaces of the gate spacers 254, isolation features 230, as well as wrapping around the surfaces of the epitaxial source features 260A and epitaxial drain features 260B. In an embodiment, the CESL 270 directly contacts the top and side surfaces of the epitaxial source layer 262A and epitaxial drain layer 262B. The CESL 270 may include any suitable materials, such as silicon oxide, silicon nitride, silicon oxynitride, silicon carbon nitride, silicon oxycarbide, silicon oxycarbon nitride, or combinations thereof. In an embodiment, the CESL layer may have a thickness of about 1 nm to about 10 nm. If the thickness is too small, such as smaller than 1 nm, the reliability of the CESL in protecting against etching may be compromised; while if the thickness is too large, such as larger than 10 nm, it takes up spaces that otherwise may be used to form contact features and causes the contact resistance to increase.

An inter-level dielectric (ILD) layer 272 is then formed over the CESL, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 272 is disposed between adjacent gate structures 250. In an embodiment, ILD layer 272 is formed by a flowable CVD (FCVD) process that includes, for example, depositing a flowable material (such as a liquid compound) over device 200 and converting the flowable material to a solid material by a suitable technique, such as thermal annealing and/or ultraviolet radiation treating. ILD layer 272 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In an embodiment, ILD layer 272 is a dielectric layer that includes a low-k dielectric material (generally referred to as a low-k dielectric layer). ILD layer 272 can include a multilayer structure having multiple dielectric materials. ILD layer 272 may be a portion of a multilayer interconnect (MLI) feature disposed over substrate 202. In an embodiment, the CESL 270 and the ILD layer 272 include materials different from each other. For example, where ILD layer 272 includes a low-k dielectric material, the CESL includes silicon and nitrogen, such as silicon nitride or silicon oxynitride. Subsequent to the deposition of ILD layer 272 and the CESL, a CMP process or other planarization process can be performed such that a top surface of dummy gate stacks 240 is exposed. In an embodiment, the planarization process removes hard mask layers of dummy gate stacks 240 to expose underlying dummy gate electrode layer 235.

Figure 15D:
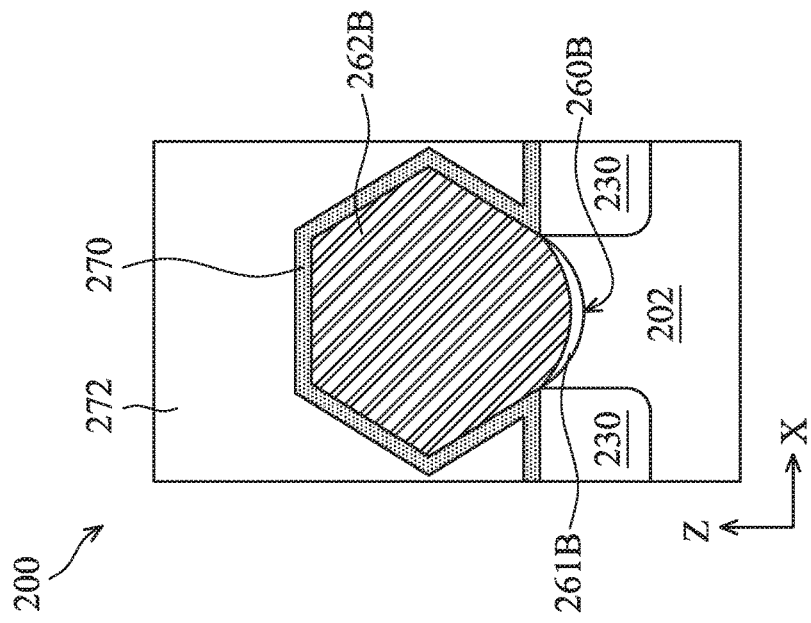
Figure 15C:
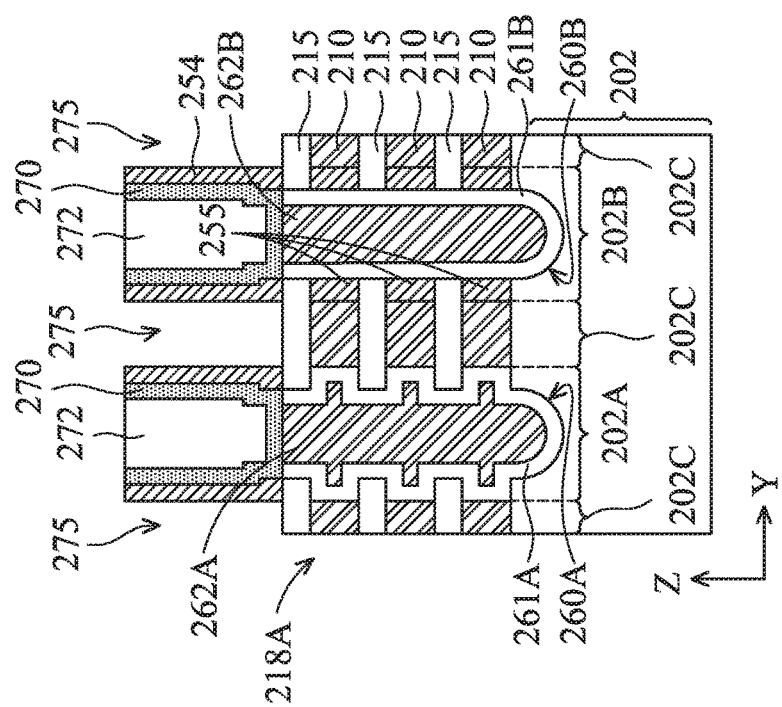

Still referring to block 122 of FIG. 1 and further referring to FIGS. 15C and 15D, dummy gate stacks 240 are removed from gate structures 250, thereby forming openings 275 over and exposing semiconductor layer stacks 205 of fins 218A, 218B. In an embodiment, an etching process completely removes dummy gate stacks 240 to expose semiconductor layers 215 and semiconductor layers 210 in openings 275. The etching process is a dry etching process, a wet etching process, other suitable etching process, or combinations thereof. In an embodiment, the etching process is a multi-step etch process. For example, the etching process may alternate etchants to separately remove various layers of dummy gate stacks 240, such as the dummy gate electrode layers, the dummy gate dielectric layers, and the hard mask layers. In an embodiment, the etching process is configured to selectively etch dummy gate stacks 240 with minimal (to no) etching of other features of device 200, such as ILD layer 272, gate spacers 254, isolation features 230, semiconductor layers 215, and semiconductor layers 210. In an embodiment, a lithography process, such as those described herein, is performed to form a patterned mask layer that covers ILD layer 272 and gate spacers 254, and the etching process uses the patterned mask layer as an etch mask.

Referring to block 124 of FIG. 1 and FIGS. 16C and 16D, semiconductor layers 210 of semiconductor layer stack 205 (exposed by gate openings 275) are selectively removed, thereby forming suspended semiconductor layers 215 in channel regions 202C. For example, the remaining portions of semiconductor layers 210 are removed in their entity. In an embodiment, an etching process selectively etches semiconductor layers 210 with minimal etching of semiconductor layers 215 and, in some embodiments, minimal (to no) etching of gate spacers 254, and inner spacers 255. As described above, the inner spacers 255 shield the epitaxial layers 261B and 262B on the drain side from being reached by the etching process such that they are not compromised by the etching chemical. However, as described above, no similar inner spacers are formed on the source side to protect the epitaxial features. Accordingly, the epitaxial layer 261A is exposed to etching chemical on the source side. In order to prevent damages to the source features, it is beneficial to maintain a good etching selectivity between the epitaxial layer 261A and the semiconductor layer 210. In some embodiments, the epitaxial layers 261A may have a composition that is similar to the semiconductor layer 215 and dissimilar from the composition of the semiconductor layer 210. Accordingly, the etching process minimally (or does not) etches the epitaxial layer 261A. This configuration enables the inner layers of the source/drain features 260A, such as the epitaxial layer 262A, to have more material options even in absence of the inner spacer protection on the source side. For example, in some embodiments, the epitaxial layer 262A may have a material composition that is the same as or similar to the material composition of the semiconductor layers 210. For example, the epitaxial layer 262A and the semiconductor layer 210 may both include silicon germanium. Accordingly, there is no or minimal etching selectivity between these two layers in the wire lease process. In absence of the epitaxial layer 261A, the epitaxial layer 262A (having the same material composition as the semiconductor layer 210) will be targeted by the etching chemical during the wire release process. Here, the epitaxial layer 261A surrounding the epitaxial layer 262A and having a dissimilar material (such as silicon), protects the epitaxial layer 262A from being compromised in such etching processes.

The etching process is a dry etching process, a wet etching process, other suitable etching process, or combinations thereof. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 and the material of the epitaxial layer 261A (in the depicted embodiment, both are silicon) (i.e., the etchant has a high etch selectivity with respect to the material of semiconductor layers 210). In an embodiment, a dry etching process (such as an RIE process) utilizes a fluorine-containing gas (for example, SF6) to selectively etch semiconductor layers 210. In an embodiment, a ratio of the fluorine-containing gas to an oxygen-containing gas (for example, $O_2$), an etching temperature, and/or an RF power may be tuned to selectively etch silicon germanium. In an embodiment, a wet etching process utilizes an etching solution that includes ammonium hydroxide ($NH_4OH$) and water ($H_2O$) to selectively etch semiconductor layers 210. In an embodiment, a chemical vapor phase etching process using hydrochloric acid (HCl) selectively etches semiconductor layers 210. In an embodiment, a minimal portion (to none) of the semiconductor layers 215 is also etched.

Suspended semiconductor layers 215 are thus exposed in openings 275. In an embodiment, four suspended semiconductor layers 215 are vertically stacked and exposed in the channel region 202C and will provide four channels through which current will flow between respective epitaxial source/drain features during operation of the transistors. Suspended semiconductor layers 215 are thus referred to as channel layers 215 hereinafter. Channel layers 215 are vertically separated from each other and from the substrate 202 by gaps 277. The gaps 277 may each have a vertical spacing along the Z-direction. This vertical spacing may be largely determined by the thickness of the semiconductor layers 210 and substantially the same as the thickness (or height) of the inner spacers 255 along the Z-direction. In an embodiment, the vertical spacing may be about 3 nm to about 15 nm. The process depicted in FIG. 16C can be referred to as a channel (or wire) release process. In an embodiment, after removing semiconductor layers 210, an etching process is performed to modify a profile of channel layers 215 to achieve desired dimensions and/or desired shapes. As a result, the thicknesses of the channel layers 215 may be reduced.

Figure 17D:
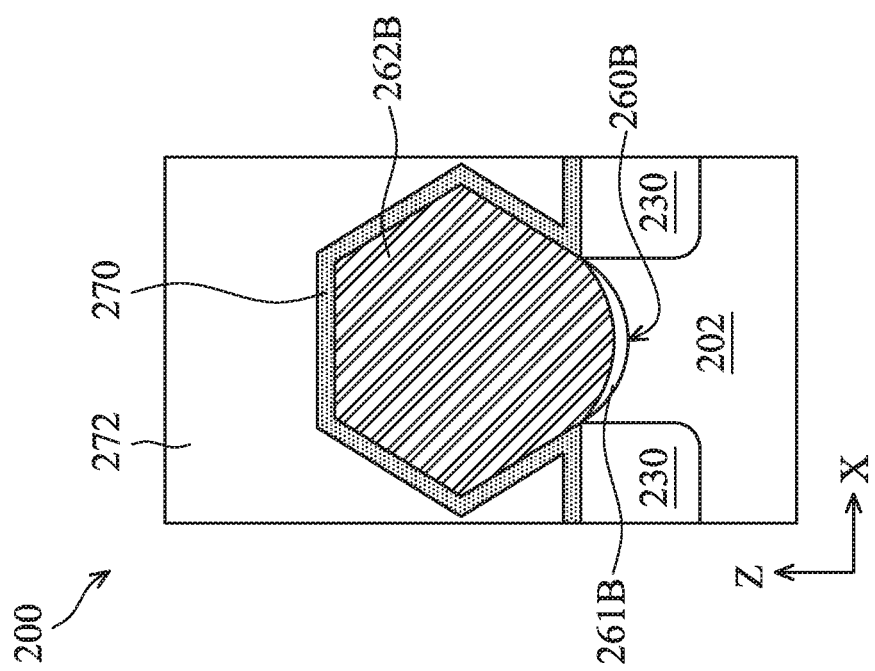
Figure 17C:
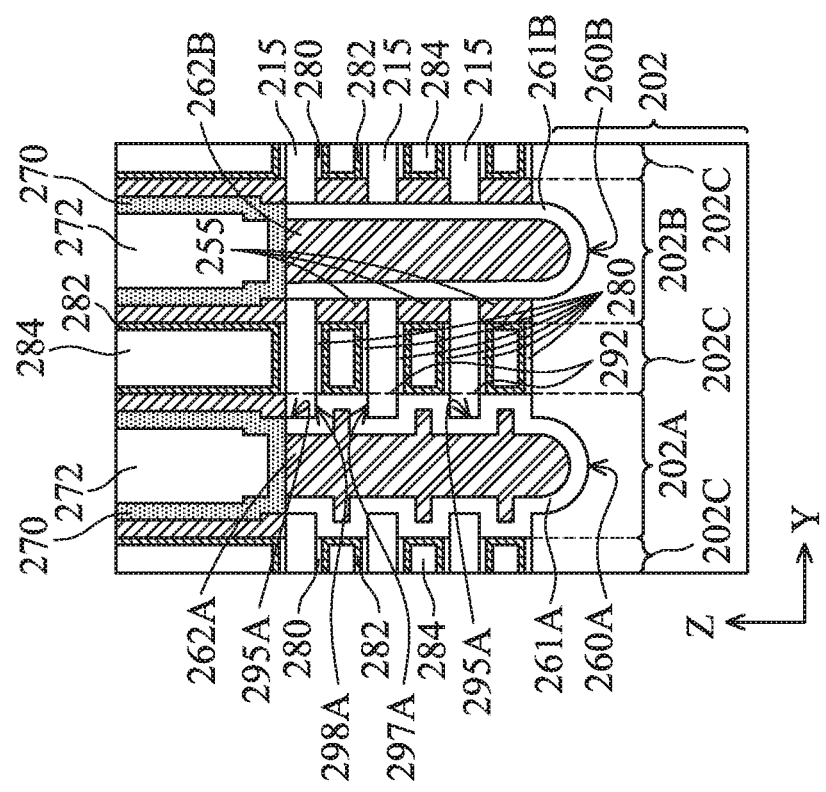

Referring to block 126 of FIG. 1 and FIGS. 17C and 17D, a gate dielectric layer 282 is formed over the device, where the gate dielectric layer 282 partially fills gate openings 275 and wraps (surrounds) channel layers 215. The dielectric layer 282 partially fills gaps 277 (see FIG. 16C) between vertically adjacent channel layers 215 and between channel layers 215 and substrate 202. In an embodiment, gate dielectric layer 282 are also disposed on gate spacers 254. For example, the gate dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In an embodiment, high-k dielectric layer 282 has a thickness of about 1 nm to about 5 nm. High-k dielectric layer 282 is formed by any of the processes described herein, such as ALD, CVD, PVD, oxidation-based deposition process, other suitable process, or combinations thereof. In an embodiment, an interfacial layer 280 is disposed between the dielectric layer 282 and channel layers 215. The interfacial layer 280 may include any suitable materials, such as silicon oxide, silicon oxynitride, HfSiO, or combinations thereof. In an embodiment, the interfacial layer 280 has a thickness of about 0.5 nm to about 3 nm. If the gate dielectric layer 282 (and interfacial layer 280, if present) is too thin, they may not reliably perform the intended functionalities; if the gate dielectric layer 282 (and interfacial layer 280, if present) is too thick, they may unnecessarily take up spaces that otherwise may be used to form gate electrodes having reduced resistances.

In some embodiments, the gate dielectric layer 282 is formed on (for example, in direct contact with) the sidewalls of the epitaxial source layer 261A in the source region 202A. Meanwhile, the gate dielectric layer 282 is formed on sidewalls of the inner spacers 255 in the drain region 202B.

A gate electrode layer 284 is formed over the gate dielectric layer 282. For example, an ALD process conformally deposits the gate electrode layer 284 on gate dielectric layer 282, such that gate electrode layer 284 completely fills gate openings 275, including the remaining portions of gaps 277. For example, gate electrode layer 284 is disposed along sidewalls, tops, and bottoms of channel layers 215. A thickness of gate electrode layer 284 is configured to fill any remaining portions of gaps 277 between vertically adjacent channel layers 215 and between channel layers 215 and substrate 202. In an embodiment, the gate electrode layers 284 may include work function layers. For example, a p-type work function layer may be formed in an n-type doped region for a p-type device, and an n-type work function layer may be formed in a p-type doped region for an n-type device. The work function layers may be formed conformally over and between the high-k dielectric layers 282 and have a thickness of about 1 nm to about 10 nm. P-type work function layer includes any suitable p-type work function material, such as TiN, TaN, TaSN, Ru, Mo, Al, WN, WCN ZrSi$_2$, MoSi$_2$, TaSi$_2$, NiSi$_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In an embodiment, the gate electrode layers 284 may include a metal fill (or bulk) layer formed over device 200, particularly over p-type and n-type work function layers. For example, a CVD process or a PVD process deposits metal fill layer on work function layers such that metal fill layer fills any remaining portion of gate openings 275, including any remaining portions of gaps 277. Metal fill layer includes a suitable conductive material, such as Al, W, and/or Cu. Metal fill layer may additionally or collectively include other metals, metal oxides, metal nitrides, other suitable materials, or combinations thereof. Alternatively, metal fill layer and/or the work function layer can be formed using any suitable deposition process, such as ALD, CVD, PVD, HDPCVD, MOCVD, RPCVD, PECVD, LPCVD, ALCVD, APCVD, spin coating, plating, other deposition process, or combinations thereof. A planarization process is performed to remove excess gate materials. For example, a CMP process is performed until a top surface of ILD layer 272 is reached (exposed), such that a top surface of dummy gate stacks 240 are substantially planar with a top surface of ILD layer 272 after the CMP process.

Figure 18D:
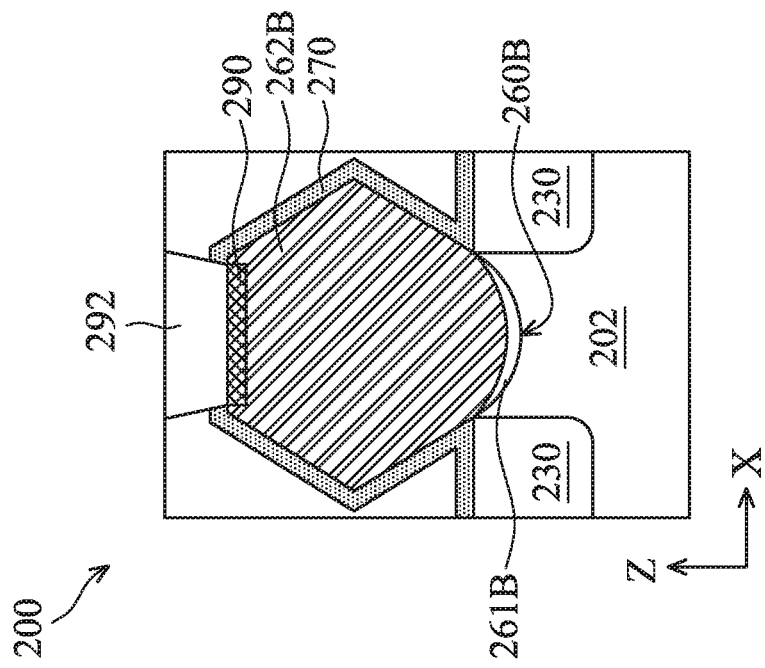
Figure 18C:
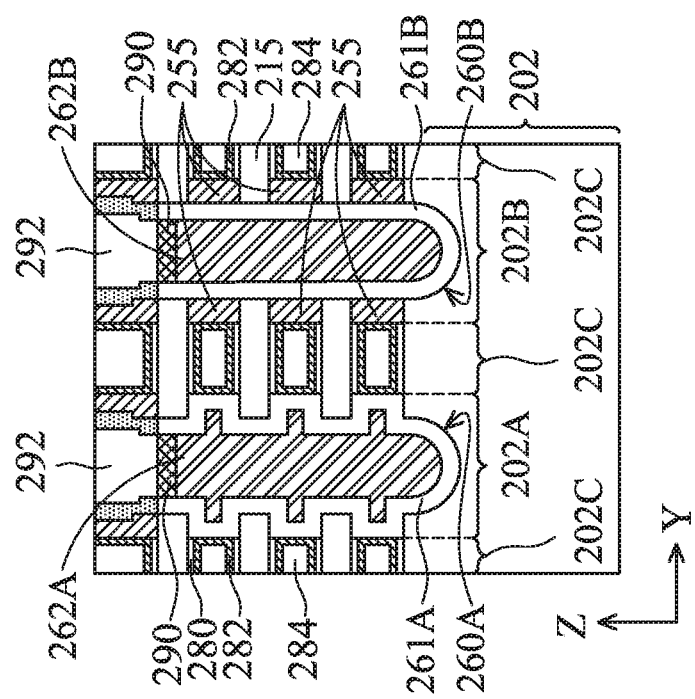

Referring to block 128 of FIG. 1 and FIGS. 18C and 18D, fabrication can proceed to complete the device. For example, openings may be formed in the ILD 272 to expose top surfaces of the epitaxial source features 260A and the epitaxial drain features 260B. Contact features 292 may then be formed in the openings to interface with the exposed top surfaces of the epitaxial source features 260A and the epitaxial drain features 260B. Contact features 292 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In an embodiment, the device is treated (for example, annealed) to form silicide features 290 at the interface between the contact features 292 and the epitaxial source features 260A and between the contact features 292 and the epitaxial drain features 260B. Moreover, one or more ILD layers, similar to ILD layer 272, and/or CESL layers can be formed over substrate 202 (in particular, over ILD layer 272 and gate structures 250).

Additional processing steps may be included before or after any processing steps of FIG. 1. Moreover, sequences of the steps of FIG. 1 may be altered without departing from the spirit of the present disclosure. For example, the above disclosure primarily describes embodiments where the epitaxial source features are formed prior to the epitaxial drain features. Alternatively, the epitaxial drain features may be formed prior to the epitaxial source features. Such modifications are also contemplated by the present disclosure.

As can be seen from the above descriptions, there may be several unique characteristics of the devices provided by the present disclosure. For example, the device may include an inner spacer layer in the drain region but not in the source region. For example, the device may include a gate portion that interfaces with an epitaxial material in the source region and with a dielectric material in the drain region. For example, the device may include two epitaxial source layers in the source region, each having a different epitaxial material from each other; while include two epitaxial drain layer in the drain region, each having the same epitaxial material. For example, the device may include two epitaxial source layers in the source region, while include only one epitaxial drain layer in the drain region. For example, the device may include a p-type transistor and an n-type transistor. The p-type transistor may include a first epitaxial source layer and a second epitaxial source layer formed on and between the first epitaxial source layer. The first epitaxial source layer and the second epitaxial source layers include different materials. The p-type transistor may further include a first epitaxial drain layer and a second epitaxial drain layer. The first epitaxial drain layer and the second epitaxial drain layer may have the same material. The n-type transistor may include a third epitaxial source layer and a fourth epitaxial source layer. The third epitaxial source layer and the fourth epitaxial source layers include the same materials. The n-type transistor may further include a third epitaxial drain layer and a fourth epitaxial drain layer. The third epitaxial drain layer and the fourth epitaxial drain layer may have the same material.

Though not intended to be limiting, embodiments of the present disclosure offer benefits for semiconductor processing and semiconductor devices. For example, as indicated above and illustrated in FIGS. 18C and 18D, in the source region 202A, the channel layers 215 directly contact the epitaxial source features 260A not only at the vertical interfaces 295A, but also at horizontal surfaces 297A and 298A. Accordingly, as the current (e.g., charge carriers) travel through the narrow channel layers 215 towards the contact features 292, the current may spread into the epitaxial source layers 261A (such as through surfaces 297A and 298A) as soon as the charge carriers pass the imaginary surface 292. As compared to embodiments with inner spacers formed on and below surfaces 297A and 298A, the charge carriers only need to travel a shorter distance before charge spreading occurs. In other words, the extent of current crowding issue is mitigated. Accordingly, the operational speeds of the device increase. Additionally, the methods provided herein maintain the inner spacers in the drain region 202B such that parasitic capacitances are reduced. Different embodiments may have different benefits. Not all benefits are necessary for any embodiments.

In an exemplary aspect, the present disclosure is directed to a device. The device includes a semiconductor substrate, a source feature and a drain feature over the semiconductor substrate, a stack of semiconductor layers interposed between the source feature and the drain feature, a gate portion, and an inner spacer of a dielectric material. The gate portion is between two vertically adjacent layers of the stack of semiconductor layers and between the source feature and the drain feature. Moreover, the gate portion has a first sidewall surface and a second sidewall surface opposing the first sidewall surface. The inner spacer is on the first sidewall surface and between the gate portion and the drain feature. The second sidewall surface is in direct contact with the source feature.

In some embodiments, the source feature includes a first source layer and a second source layer over the first source layer. The first source layer has a first source material and the second source layer has a second source material. The second source material is different from the first source material. In some embodiments, the drain feature includes a first drain layer and a second drain layer over the first drain layer. The first drain layer has a first drain material and the second drain layer has a second drain material. The second drain material is substantially the same as the first drain material. In some embodiments, the first drain layer directly contacts the inner spacer. In some embodiments, a layer of the stack of semiconductor layers includes a top surface and a side surface, and the first source layer includes a first portion on and extending along the top surface and a second portion on and extending along the side surface. In some embodiments, the gate portion includes a gate dielectric layer, and the first source layer physically interfaces with the gate dielectric layer. In some embodiments, the drain feature directly contacts the inner spacer. In some embodiments, the dielectric material is a first dielectric material. The gate portion includes a second dielectric material on the first and the second sidewall surfaces. Moreover, the source feature interfaces with the second dielectric material on the second sidewall surface, and the drain feature interfaces with the inner spacer on the first sidewall surface. In some embodiments, a layer of the stack of semiconductor layers includes a first portion interfacing with the source feature, a second portion interfacing with the drain feature, and a third portion between the first portion and the second portion and over the gate portion. A bottom surface of the first portion interfaces with an epitaxial material, and a bottom surface of the second portion interfaces with the spacer material. In some embodiments, the stack of semiconductor layers is a first stack of semiconductor layers, and the device further includes a second stack of semiconductor layers and a third stack of semiconductor layers. The source feature is between the first and the second stack of semiconductor layers, and the drain feature is between the first and the third stack of semiconductor layers. A layer of the second stack of semiconductor layers includes an end portion directly interfacing with the source feature on at least three sides. A layer of the third stack of semiconductor layers includes an end portion directly interfacing with the drain feature on one side and interfacing with the inner spacer on another side.

In an exemplary aspect, the present disclosure is directed to a method. The method includes receiving a structure. The structure includes a semiconductor substrate, a stack of first semiconductor layers and second semiconductor layers, and a dummy gate structure over the stack. The first semiconductor layers and the second semiconductor layers have different material compositions and alternate with one another within the stack. The method also includes removing a first portion of the stack on source side of the dummy gate structure to form a source trench, thereby exposing first sidewall surfaces of the stack in the source trench. The method further includes removing a first segment of the first semiconductor layers from the exposed first sidewall surfaces to form first gaps; and epitaxially growing a source feature in the source trench and the first gaps. Moreover, the method includes removing a second portion of the stack on drain side of the dummy gate structure to form a drain trench, thereby exposing second sidewall surfaces of the stack in the drain trench. The method further includes removing a second segment of the first semiconductor layers from the exposed second sidewall surfaces to form second gaps. Inner spacers are then formed in the second gaps. The method additionally includes epitaxially growing a drain feature in the drain trench. The method additionally includes removing the dummy gate structure to form a gate opening over the stack; removing a third segment of the first semiconductor layers from the gate opening to form extended gate openings; forming a gate dielectric in the extended gate opening; and forming a gate electrode over the gate dielectric in the extended gate opening.

In some embodiments, the removing of the first segment of the first semiconductor layers includes forming first side surfaces of the first semiconductor layers; and the epitaxially growing of the source feature includes growing on the first side surfaces. In some embodiments, the epitaxially growing of the drain feature includes growing the drain feature to cover sidewall surfaces of the inner spacers. In some embodiments, the epitaxially growing of the source feature includes growing a first source layer of a first source material in the source trench and the first gaps, and growing a second source layer of a second source material over the first layer. The second source material is different from the first source material. In some embodiments, the epitaxially growing of the drain feature includes growing a first drain layer of a first drain material in the drain trench, and growing a second drain layer of a second drain material over the first drain layer. The second drain material is substantially the same as the first drain material. In some embodiments, the forming of the gate dielectric includes forming the gate dielectric on a sidewall surface of the source feature and on sidewall surfaces of the inner spacers. In some embodiments, the epitaxially growing of the source feature includes epitaxially growing between vertically adjacent second semiconductor layers.

In an exemplary aspect, the present disclosure is directed to a method. The method includes receiving a structure. The structure includes a semiconductor substrate and a stack of first semiconductor layers and second semiconductor layers disposed over the semiconductor substrate. The first semiconductor layers and the second semiconductor layers have different material compositions and alternate with one another within the stack. The method also includes patterning the stack to form a fin structure; forming a dummy gate structure over the fin structure; etching a source trench in the stack on a first side of the dummy gate structure; laterally etching the first semiconductor layers to form first gaps; forming a source feature in the source trench and the first gaps; etching a drain trench in the stack on a second side of the dummy gate structure opposite to the first side; laterally etching the first semiconductor layers to form second gaps; forming inner spacers in the second gaps; forming a drain feature in the drain trench; removing the dummy gate structure to form a first gate opening; removing a remaining portion of the first semiconductor layers to form a second gate opening; and forming a gate structure in the first and the second gate openings.

In some embodiments, the forming of the source feature includes epitaxially growing the source feature on a sidewall surface of the etched first semiconductor layers. Moreover, the forming of the drain feature includes epitaxially growing the drain feature to cover sidewall surfaces of the inner spacers. In some embodiments, the forming of the source feature includes forming a first source layer and a second source layer over the first source layer. Furthermore, the forming of the drain feature includes forming a first drain layer and a second drain layer over the first drain layer. The first source layer has a different surface profile than the first drain layer. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a semiconductor substrate;
a source feature and a drain feature over the semiconductor substrate;
a stack of semiconductor layers interposed between the source feature and the drain feature;
a gate portion between two vertically adjacent layers of the stack of semiconductor layers and between the source feature and the drain feature, the gate portion having a first sidewall surface and a second sidewall surface opposing the first sidewall surface;
an inner spacer on the first sidewall surface and between the gate portion and the drain feature, the inner spacer being of a dielectric material;
wherein the second sidewall surface is in direct contact with the source feature.

2. The device of claim 1, wherein the source feature includes a first source layer and a second source layer over the first source layer, wherein the first source layer has a first source material and the second source layer has a second source material, and wherein the second source material is different from the first source material.

3. The device of claim 2, wherein the drain feature includes a first drain layer and a second drain layer over the first drain layer, wherein the first drain layer has a first drain material and the second drain layer has a second drain material, and wherein the second drain material is substantially the same as the first drain material.

4. The device of claim 3, wherein the first drain layer directly contacts the inner spacer.

5. The device of claim 2, wherein a layer of the stack of semiconductor layers includes a top surface and a side surface, and the first source layer includes a first portion on and extending along the top surface and a second portion on and extending along the side surface.

6. The device of claim 2, wherein the gate portion includes a gate dielectric layer, and the first source layer physically interfaces with the gate dielectric layer.

7. The device of claim 1, wherein the drain feature directly contacts the inner spacer.

8. The device of claim 1, wherein the dielectric material is a first dielectric material, and
wherein the gate portion includes a second dielectric material on the first and the second sidewall surfaces, the source feature interfaces with the second dielectric material on the second sidewall surface, and the drain feature interfaces with the inner spacer on the first sidewall surface.

9. The device of claim 1, wherein a layer of the stack of semiconductor layers includes a first portion interfacing with the source feature, a second portion interfacing with the drain feature, and a third portion between the first portion and the second portion and over the gate portion, wherein a bottom surface of the first portion interfaces with an epitaxial material, and a bottom surface of the second portion interfaces with the spacer material.

10. The device of claim 1, wherein the stack of semiconductor layers is a first stack of semiconductor layers, the device further comprising a second stack of semiconductor layers and a third stack of semiconductor layers,
wherein the source feature is between the first and the second stack of semiconductor layers, and the drain feature is between the first and the third stack of semiconductor layers, and
wherein a layer of the second stack of semiconductor layers includes an end portion directly interfacing with the source feature on at least three sides; and
wherein a layer of the third stack of semiconductor layers includes an end portion directly interfacing with the drain feature on one side and interfacing with the inner spacer on another side.

11. A method, comprising:
receiving a structure, wherein the structure includes:
a semiconductor substrate;
a stack of first semiconductor layers and second semiconductor layers; and
a dummy gate structure over the stack,
wherein the first semiconductor layers and the second semiconductor layers have different material compositions and alternate with one another within the stack;
removing a first portion of the stack on source side of the dummy gate structure to form a source trench, thereby exposing first sidewall surfaces of the stack in the source trench;
removing a first segment of the first semiconductor layers from the exposed first sidewall surfaces to form first gaps;
epitaxially growing a source feature in the source trench and the first gaps;
removing a second portion of the stack on drain side of the dummy gate structure to form a drain trench, thereby exposing second sidewall surfaces of the stack in the drain trench;
removing a second segment of the first semiconductor layers from the exposed second sidewall surfaces to form second gaps;
forming inner spacers in the second gaps;
epitaxially growing a drain feature in the drain trench;
removing the dummy gate structure to form a gate opening over the stack;

removing a third segment of the first semiconductor layers from the gate opening to form extended gate openings;

forming a gate dielectric in the extended gate opening; and forming a gate electrode over the gate dielectric in the extended gate opening.

12. The method of claim 11, wherein the removing of the first segment of the first semiconductor layers includes forming first side surfaces of the first semiconductor layers, and the epitaxially growing of the source feature includes growing on the first side surfaces.

13. The method of claim 12, wherein the epitaxially growing of the drain feature includes growing the drain feature to cover sidewall surfaces of the inner spacers.

14. The method of claim 11, wherein the epitaxially growing of the source feature includes:

growing a first source layer of a first source material in the source trench and the first gaps, and growing a second source layer of a second source material over the first layer, wherein the second source material is different from the first source material.

15. The method of claim 14, wherein the epitaxially growing of the drain feature includes:

growing a first drain layer of a first drain material in the drain trench, and growing a second drain layer of a second drain material over the first drain layer, wherein the second drain material is substantially the same as the first drain material.

16. The method of claim 11, wherein the forming of the gate dielectric includes forming the gate dielectric on a sidewall surface of the source feature and on sidewall surfaces of the inner spacers.

17. The method of claim 11, wherein the epitaxially growing of the source feature includes epitaxially growing between vertically adjacent second semiconductor layers.

18. A method, comprising:

receiving a structure having a semiconductor substrate and a stack of first semiconductor layers and second semiconductor layers disposed over the semiconductor substrate, wherein the first semiconductor layers and the second semiconductor layers have different material compositions and alternate with one another within the stack;

patterning the stack to form a fin structure;

forming a dummy gate structure over the fin structure;

etching a source trench in the stack on a first side of the dummy gate structure;

laterally etching the first semiconductor layers to form first gaps;

forming a source feature in the source trench and the first gaps;

etching a drain trench in the stack on a second side of the dummy gate structure opposite to the first side;

laterally etching the first semiconductor layers to form second gaps;

forming inner spacers in the second gaps;

forming a drain feature in the drain trench;

removing the dummy gate structure to form a first gate opening;

removing a remaining portion of the first semiconductor layers to form a second gate opening; and forming a gate structure in the first and the second gate openings.

19. The method of claim 18, wherein the forming of the source feature includes epitaxially growing the source feature on a sidewall surface of the etched first semiconductor layers, and the forming of the drain feature includes epitaxially growing the drain feature to cover sidewall surfaces of the inner spacers.

20. The method of claim 18, wherein:

the forming of the source feature includes forming a first source layer and a second source layer over the first source layer, the forming of the drain feature includes forming a first drain layer and a second drain layer over the first drain layer, and the first source layer has a different surface profile than the first drain layer.

* * * * *